(12) United States Patent
Feil et al.

(10) Patent No.: US 12,087,717 B2
(45) Date of Patent: Sep. 10, 2024

(54) SEMICONDUCTOR PACKAGE AND METHODS OF MANUFACTURING A SEMICONDUCTOR PACKAGE

(71) Applicant: Infineon Technologies Austria AG, Villach (AT)

(72) Inventors: Thomas Feil, Villach (AT); Danny Clavette, Greene, RI (US); Paul Ganitzer, Villach (AT); Martin Poelzl, Ossiach (AT); Carsten von Koblinski, Villach (AT)

(73) Assignee: Infineon Technologies Austria AG, Villach (AT)

( * ) Notice: Subject to any disclaimer, the term of this patent is extended or adjusted under 35 U.S.C. 154(b) by 397 days.

(21) Appl. No.: 17/369,292

(22) Filed: Jul. 7, 2021

(65) Prior Publication Data
US 2021/0335739 A1    Oct. 28, 2021

Related U.S. Application Data

(63) Continuation of application No. 16/282,420, filed on Feb. 22, 2019, now Pat. No. 11,081,457.

(30) Foreign Application Priority Data

Feb. 23, 2018    (EP) ..................................... 18158473

(51) Int. Cl.
*H01L 21/48*    (2006.01)
*H01L 21/56*    (2006.01)
(Continued)

(52) U.S. Cl.
CPC .......... *H01L 24/08* (2013.01); *H01L 21/4857* (2013.01); *H01L 21/486* (2013.01);
(Continued)

(58) Field of Classification Search
CPC ... H01L 21/4857; H01L 21/486; H01L 21/56; H01L 21/78; H01L 23/3185;
(Continued)

(56) References Cited

U.S. PATENT DOCUMENTS

| 2004/0113283 A1 | 6/2004 | Farnworth et al. |
| 2009/0160046 A1 | 6/2009 | Otremba et al. |

(Continued)

FOREIGN PATENT DOCUMENTS

| CN | 102099919 A | 6/2011 |
| EP | 2913487 A1 | 9/2015 |
| EP | 3531446 A1 | 8/2019 |

*Primary Examiner* — Farun Lu
*Assistant Examiner* — Sandra Milena Rodriguez Villan
(74) *Attorney, Agent, or Firm* — Murphy, Bilak & Homiller, PLLC

(57) ABSTRACT

In an embodiment, a semiconductor package includes a first transistor device having first and second opposing surfaces, a first power electrode and a control electrode arranged on the first surface and a second power electrode arranged on the second surface. A first metallization structure arranged on the first surface includes a plurality of outer contact pads which includes a protective layer of solder, Ag or Sn. A second metallization structure is arranged on the second surface. A conductive connection extending from the first surface to the second surface electrically connects the second power electrode to an outer contact pad of the first metallization structure. A first epoxy layer arranged on side faces and on the first surface of the transistor device includes openings which define a lateral size of the plurality of outer contact pads and a package footprint.

23 Claims, 17 Drawing Sheets

(51) Int. Cl.
*H01L 21/683* (2006.01)
*H01L 21/78* (2006.01)
*H01L 23/00* (2006.01)
*H01L 23/29* (2006.01)
*H01L 23/31* (2006.01)
*H01L 23/538* (2006.01)
*H01L 25/07* (2006.01)
*H01L 25/16* (2023.01)
*H01L 27/088* (2006.01)

(52) U.S. Cl.
CPC ............ *H01L 21/56* (2013.01); *H01L 21/561* (2013.01); *H01L 21/6835* (2013.01); *H01L 21/78* (2013.01); *H01L 23/293* (2013.01); *H01L 23/3135* (2013.01); *H01L 23/3178* (2013.01); *H01L 23/3185* (2013.01); *H01L 23/5383* (2013.01); *H01L 23/5384* (2013.01); *H01L 23/5389* (2013.01); *H01L 24/03* (2013.01); *H01L 24/05* (2013.01); *H01L 24/06* (2013.01); *H01L 24/24* (2013.01); *H01L 24/25* (2013.01); *H01L 24/73* (2013.01); *H01L 24/82* (2013.01); *H01L 24/96* (2013.01); *H01L 25/072* (2013.01); *H01L 25/16* (2013.01); *H01L 27/088* (2013.01); *H01L 23/3107* (2013.01); *H01L 24/48* (2013.01); *H01L 2221/68327* (2013.01); *H01L 2221/6834* (2013.01); *H01L 2224/0231* (2013.01); *H01L 2224/0233* (2013.01); *H01L 2224/02381* (2013.01); *H01L 2224/04042* (2013.01); *H01L 2224/05553* (2013.01); *H01L 2224/05647* (2013.01); *H01L 2224/0603* (2013.01); *H01L 2224/06182* (2013.01); *H01L 2224/08137* (2013.01); *H01L 2224/24105* (2013.01); *H01L 2224/24137* (2013.01); *H01L 2224/245* (2013.01); *H01L 2224/2518* (2013.01); *H01L 2224/48247* (2013.01); *H01L 2224/49175* (2013.01); *H01L 2224/73227* (2013.01); *H01L 2924/13055* (2013.01); *H01L 2924/13091* (2013.01)

(58) Field of Classification Search
CPC ............ H01L 23/5383; H01L 23/5384; H01L 23/293; H01L 23/3135; H01L 23/3178; H01L 23/5389; H01L 24/08; H01L 24/03; H01L 24/05; H01L 24/06; H01L 25/16; H01L 25/072; H01L 2224/0231; H01L 2224/06182; H01L 2224/08137
See application file for complete search history.

(56) References Cited

U.S. PATENT DOCUMENTS

| | | |
|---|---|---|
| 2012/0091468 A1 | 4/2012 | Choi et al. |
| 2013/0134559 A1 | 5/2013 | Lin et al. |
| 2013/0140673 A1 | 6/2013 | Haeberlen et al. |
| 2014/0138841 A1 | 5/2014 | Hosseini et al. |
| 2015/0130055 A1* | 5/2015 | Lin .................. H01L 24/14 |
| | | 257/737 |
| 2015/0221523 A1 | 8/2015 | Zundel et al. |
| 2015/0318261 A1 | 11/2015 | Chung et al. |
| 2016/0071818 A1 | 3/2016 | Wang et al. |
| 2016/0225717 A1 | 8/2016 | Palm et al. |
| 2017/0309518 A1 | 10/2017 | Uzoh et al. |

\* cited by examiner

SEMICONDUCTOR PACKAGE AND METHODS OF MANUFACTURING A SEMICONDUCTOR PACKAGE

RELATED APPLICATIONS

This Application is a continuation of and claims priority to U.S. application Ser. No. 16/282,420 filed on Feb. 22, 2019, which in turn claims priority to EPO Application 18158473.1 filed on Feb. 23, 2018, the content of each being incorporated by reference in their entirety.

BACKGROUND

In some circuits, such as power conversion, the circuit requires two or more semiconductor devices which are electrically coupled together to provide the corresponding circuit or part of the corresponding circuit. For example, in motor drivers, DC/DC converters and rectifiers, the circuit may require a combination of transistor devices which are used as a switch in a half bridge configuration that includes a low side switch and a high side switch. In a half bridge configuration, the drain of the transistor device providing the low side switch is electrically coupled to the source of the transistor providing the high side switch.

In some cases, each semiconductor device, for example, a transistor device, is accommodated within a package and the packages are electrically coupled together by means of a conductive redistribution structure positioned external to the packages. For example, the packages may be mounted on a circuit board including a conductive redistribution structure which electrically couples the packages to form the circuit or part of the circuit. Such an arrangement may, however, occupy an undesirably large lateral area for some applications.

US 2013/0140673 A1 discloses a semiconductor device including one semiconductor die in which a first field effect transistor and a second field effect transistor are monolithically integrated and form a half bridge configuration.

Semiconductor devices for power conversion circuits which occupy a smaller lateral area and methods for fabricating such semiconductor devices are desirable.

SUMMARY

In an embodiment, a semiconductor package comprises a first transistor device comprising a first surface and a second surface opposing the first surface, a first power electrode and a control electrode arranged on the first surface and a second power electrode arranged on the second surface, a first metallization structure arranged on the first surface, the first metallization structure comprising a plurality of outer contact pads, the outer contact pads comprising a protective layer of solder, Ag or Sn, a second metallization structure arranged on the second surface, a conductive connection extending from the first surface to the second surface and electrically connecting the second power electrode to an outer contact pad of the first metallization structure, and a first epoxy layer arranged on side faces and on the first surface of the transistor device. The first epoxy layer comprises openings defining the lateral size of the outer contact pads and a package footprint.

In an embodiment, a method comprises forming at least one first trench in a first surface of the semiconductor wafer in a device region, wherein the semiconductor wafer comprises separation regions arranged between component positions of the semiconductor wafer, the component positions comprising the device region comprising an electronic device, forming a first metallization structure arranged on the first surface in the component position, the first metallization structure comprising a plurality of outer contact pads forming a package footprint, and inserting conductive material into the first trench, forming at least one second trench in the first surface of the semiconductor wafer in the separation regions, applying a first epoxy layer to the first surface of a semiconductor wafer such that the second trenches and edge regions of the component positions are covered with the first epoxy layer, removing portions of a second surface of the semiconductor wafer, the second surface opposing the first surface, and revealing portions of the first epoxy layer in the separation regions and the conductive material in the first trenches and producing a worked second surface, applying a second metallization layer to the worked second surface and operably coupling the second metallization layer to the conductive material and an outer contact pad on the first major surface and cutting through the first epoxy layer in the separation regions to form a plurality of separate semiconductor packages.

In an embodiment, a method comprises forming a first metallization structure on a first surface of a semiconductor wafer, wherein the semiconductor wafer comprises separation regions arranged between component positions, the component positions comprising a device region comprising an electronic device, the first metallization structure being arranged on the component positions and comprising a plurality of outer contacts forming a package footprint, forming at least one second trench in the first surface of the semiconductor wafer in the separation regions, applying a first epoxy layer to the first surface of a semiconductor wafer such that the second trenches, and edge regions of the component positions are covered with the first epoxy layer, removing portions of a second surface of the semiconductor wafer, the second surface opposing the first surface, and revealing portions of the first epoxy layer in the separation regions, forming at least one first trench in the worked second surface of the semiconductor wafer in the device region of the component position, inserting conductive material into the first trench, applying a second metallization layer to the worked second surface and operably coupling the second metallization layer to the conductive material and an outer contact pad on the first major surface, and cutting through the first epoxy layer in the separation regions to form a plurality of separate semiconductor packages.

In an embodiment, a module comprises a first electronic device in a first device region and a second electronic device in a second device region, wherein the first electronic device is operably coupled to the second electronic device to form a circuit. The module further comprises a first major surface comprising at least one contact pad, a second major surface comprising at least one contact pad, the second major surface opposing the first major surface, a first epoxy layer arranged on the first major surface that leaves at least portions of the first contact pad exposed. Side faces of the first electronic device and of the second electronic device are embedded in, and in direct contact with, the first epoxy layer. The module further comprises a conductive redistribution structure that electrically couples the first electronic device with the second electronic device to form the circuit. The conductive redistribution structure comprises a conductive via extending from the first major surface to the second major surface and a conductive layer that is arranged on the conductive via and on at least one of the first device region and on the second device region.

In an embodiment, an electronic component comprises a module according to any one of the embodiments described herein, a plurality of leads and a plastic housing composition. The first contact pad of the module is coupled to a first lead and the second contact pad of the module is coupled to a second lead of the plurality of leads. The plastic housing composition covers the first epoxy layer.

In an embodiment, a method for manufacturing a semiconductor module comprises forming at least one trench in non-device regions of a first surface of a semiconductor wafer and forming at least one trench in non-circuit regions the first surface of the semiconductor wafer. The non-device regions are arranged between component positions and the component positions comprising at least two semiconductor devices for forming a circuit. A non-circuit region is arranged between a first device region comprising a first electronic device and a second device region comprising a second electronic device, a first metallization layer being arranged on the first surface in the first device region and in the second device region. The method further comprises applying a first polymer layer to the first surface of a semiconductor wafer such that the trenches, edge regions of the component positions, edge regions of the first device regions and edge regions of the second device regions are covered with the first polymer layer, removing portions of a second surface of the semiconductor wafer, the second surface opposing the first surface, revealing portions of the first polymer layer in the non-device regions and in the non-circuit regions and producing a worked second surface. The method further comprises applying a second metallization layer to the worked second surface and operably coupling the first electronic device to the second electronic device to form the circuit and inserting a separation line through the first polymer layer in the non-device regions to form a plurality of separate semiconductor dies comprising the circuit.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
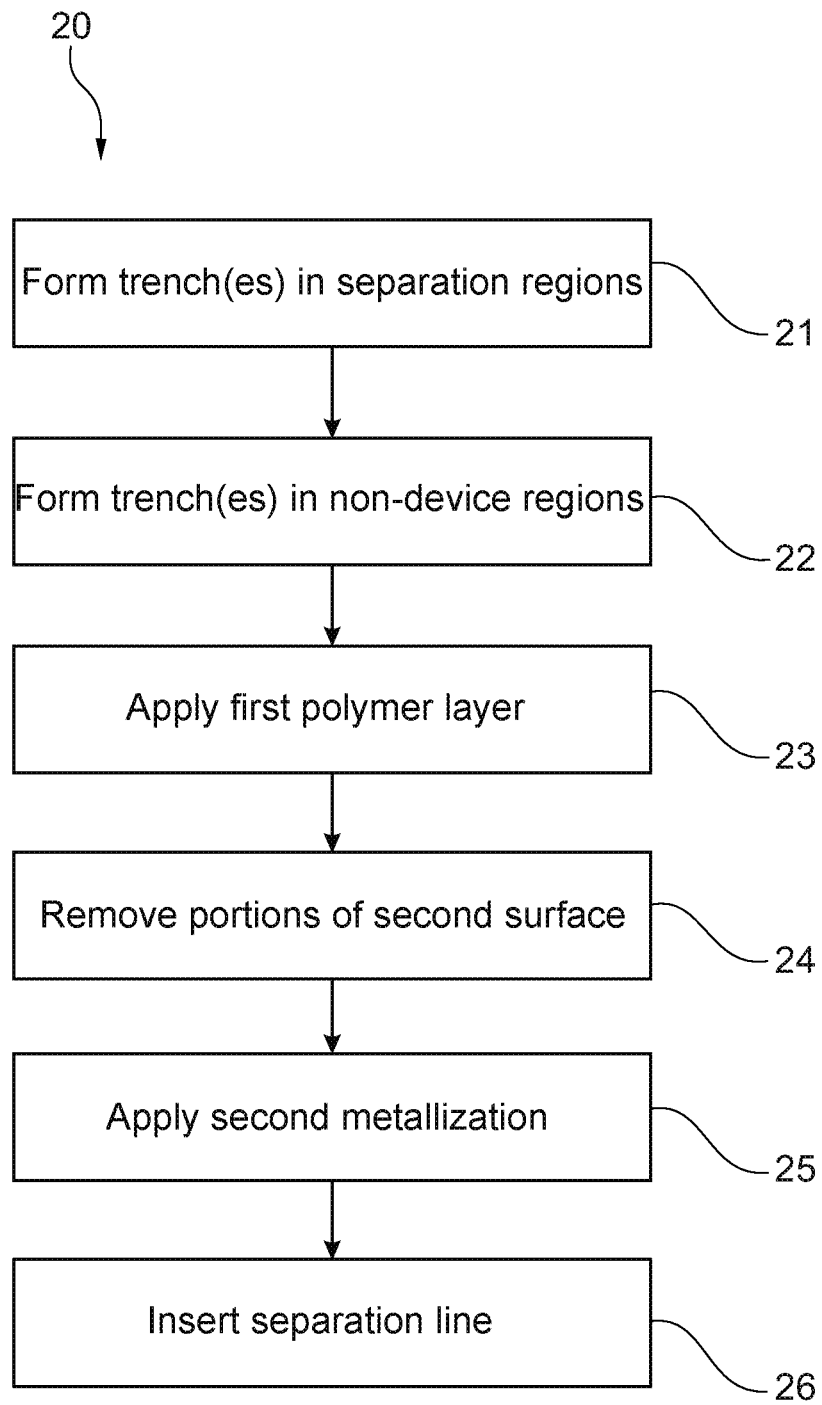
FIG. 1 illustrates a flow diagram of a method for fabricating a semiconductor module.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In power conversion applications, the corresponding circuits commonly require a combination of transistors, such as Field Effect Transistors (FETs), to form, for example the high- and low-side of a buck converter, to be positioned as close as possible. The individual placing of chips requires minimum spacing distances which limits the possible shrink of the package. Wider spacings may also increase stray inductivities which impact the performance of the package.

Some embodiments described herein provide a semiconductor package with a single semiconductor die that includes a single semiconductor device, in particular a single semiconductor device for power conversion. In some embodiments, the single semiconductor device is a transistor device such as a vertical MOSFET (Metal Oxide Semiconductor Field Effect Transistor) or vertical IGBT (Insulated Gate Bipolar Transistor). The semiconductor package has a smaller package footprint and occupies a smaller lateral area as the drain outer contact as well as the source outer contact and gate outer contact of the package are positioned on, and within the lateral area of, the semiconductor die providing the transistor device.

Some embodiments described provide include a multi-chip or multi-device single die module that enables closer spacing of chips within the module and simultaneously allows a direct electrical connection between source and drain of two devices, e.g. vertical transistor devices, by means of a via, for example a through silicon via (TSV). The module can be packaged in standard plastic packages or is ready for chip embedding or may be used as a final package without further packaging.

FIG. 1 illustrates a flow diagram 20 of a method for fabricating a semiconductor module which includes a first electronic device and a second electronic device which are coupled to form a circuit. In block 21, at least one trench is formed in separation regions of a first surface of a semiconductor wafer. In block 22, at least one trench is formed in non-device regions of the first surface of the semiconductor wafer. The separation regions are arranged between component positions of the semiconductor wafer. The component positions may each comprise at least two electronic devices for forming a circuit and a non-device region arranged between a first device region comprising a first electronic device and a second device region comprising a second electronic device. A first metallization structure is arranged on the first surface of the semiconductor wafer in the first device region and in the second device region.

In block 23, a first polymer layer is applied to the first surface of the semiconductor wafer such that the trenches in both the separation regions and the non-device regions, edge regions of the component positions, edge regions of the first device regions and edge regions of the second device regions are covered with the first polymer layer. The polymer layer may include a curable polymer composition, such as a thermosetting polymer resin and may include epoxy.

In block 24, portions of a second surface of the semiconductor wafer, the second surface opposing the first surface, are removed and portions of the first polymer layer positioned in the separation regions and in the non-device regions are exposed and a worked second surface is produced.

The thickness of the semiconductor wafer is reduced and may be reduced to a predetermined thickness. In these embodiments, the depth of the trenches in the separation regions and in the non-device regions may be selected to be greater than the desired final thickness of the semiconductor wafer, such that portions of the first polymer layer arranged in the trenches formed in the separation regions and in the non-device regions are exposed after the thickness of the semiconductor wafer has been reduced to the predetermined desired thickness.

In block 25, a second metallization layer is applied to the worked second surface. The first electronic device is operably coupled to the second electronic device to form the desired circuit.

In block 26, a separation line is inserted through the first polymer layer positioned in the separation regions to form a plurality of separate semiconductor modules, each semiconductor module comprising the circuit. Each semiconductor module includes the first electronic device and the second electronic device which are operably coupled to form the circuit. The separation line may be inserted by mechanical sawing or laser cutting, for example.

The semiconductor module includes two device regions comprising semiconductor material. The semiconductor material may be silicon, for example. Each semiconductor module includes two or more electronic devices which are laterally separated from one another by the portion of the first polymer layer arranged in the non-device region which is laterally positioned between the first device region comprising the first electronic device and the second device region comprising the second electronic device. The sidewalls of the module and edges formed between the sidewalls and the first surface and the second surface of the device regions may be covered and in direct contact with the first polymer layer. The first polymer layer may be used to protect the side faces and edges. This arrangement may be used to simplify handling of the module using automated equipment.

The module may be subsequently packaged and the exposed portions of the first and second metallization layers provide contact pads which may be electrically coupled to the external contact pads of the package by an internal conductive redistribution structure. In some embodiments, the module may be used in a circuit or application without being further packaged.

As an example, the first electronic device may include a transistor device, for example a field effect transistor device such as a MOSFET or insulated gate bipolar transistor (IGBT). The second electronic device may also comprise a transistor device, for example a field effect transistor device such as a MOSFET or insulated gate bipolar transistor (IGBT), or may include a driver device, such as a gate driver device, or part of a gate driver device, such as a pull-down FET (Field Effect Transistor), or may include a passive device, such as an inductor, a capacitor, or a resistor. If two transistor devices are provided, the module may provide a half bridge circuit with appropriate electrical connections between the two transistor devices.

In some embodiments, each component position may comprise more than two electronic devices for forming a particular circuit. As an example, the circuit may be half bridge configuration in the case of both the first electronic device and the second electronic device being a transistor and the component position may further include a driver device, or part of a driver device, such as a pull-down FET, that is coupled to the gates of the two transistor devices.

The non-device regions do not include any device structures and may laterally surround the first device region and the second device region. The separation regions which are positioned between immediately adjacent component positions are typically also free of device structures. In some embodiments, the component positions are arranged in a regular array of rows and columns such that the trenches formed in the separation regions have the form of a square or rectangular grid in plan view.

The device regions in each component position may have different lateral arrangements. In some embodiments, the device regions within each electronic component position are arranged laterally adjacent one another, such that the trenches formed in the non-device regions extend substantially parallel to one another. In some embodiments, the device regions within each electronic component position are arranged laterally such that one device region is separated from the other device region by two substantially perpendicular non-device regions and such that the trenches formed in the non-device regions extend substantially perpendicular to one another. For example, one device region may be arranged in a corner of a laterally square or rectangular component position such that it is bounded by two substantially perpendicular separation regions and by two substantially perpendicular non-device regions. The other device region may have an L-shape. In some embodiments, one device region is laterally surrounded in all sides by a further device region such that a non-device region having a continuous ring-form surrounds the inner device region. For example, an inner device region may be substantially square or rectangular and be laterally surrounded by a substantially square or rectangular continuous non-device region which in turn is laterally surrounded by a square or rectangular ring-shaped further device region. The inner device region and the outer device region may be concentric or non-concentrically arranged with respect to one another.

In some embodiments, in block 25, the second metallization layer is applied such that it operably couples, for example electrically connects, the first electronic device to the second electronic device to form the circuit. In other embodiments, the first electronic device and the second electronic device may be electrically connected by the first metallization structure and the removal of portions of the second surface of the semiconductor wafer results in the semiconductor body of the two electronic devices being electrically insulated from one another. The second metallization layer may provide a ground plane in these embodiments.

In some embodiments, the method further comprises forming a vertical conductive connection that extends between the first and second surfaces of the wafer. The vertical conductive connection may be used to electrically couple the first and second electronic devices. A vertical conductive connection may be used if one or more of the electronic devices is a vertical device having a vertical drift path, for example.

In some embodiments, the method further comprises inserting one or more vias or through-holes into the first device region or the second device region, inserting conductive material into the via and electrically coupling the conductive material within the via to the first electronic device and to the second electronic device. In some embodiments, a via may be inserted into both the first device region and the second device region. In some embodiments, two or more vias may be inserted into at least one of the first device region and the second device region. The number and position of the vias may be selected depending on the circuit which is to be formed, the structure of the first and second electronic devices and on the current carrying capacity required by the via structure.

The via may be inserted into the first surface of the semiconductor wafer and, afterwards, the first metallization structure and the first polymer layer is applied to the first surface and subsequently, portions of the second surface of the semiconductor wafer are removed to form the worked second surface. Alternatively the via may be inserted into the first surface of the semiconductor wafer before the first metallization structure is applied.

An insulating material may be inserted into the one or more vias or through-holes formed in the first device region or the second device region before the conductive material is inserted into the via. The insulating material may line the side walls of the via or through-hole and contain insulation to the surrounding device body.

In some embodiments, a further conductive layer is applied to the first metallization structure, for example, to increase the thickness of the regions which are to provide the contact pads. The conductive material may be inserted into the via before the further conductive layer is applied such that this further conductive layer electrically couples the conductive material within the via to the first metallization structure. Alternatively, the conductive material can be inserted into the via and a further conductive layer applied to one or both of the major surfaces in the same deposition process.

In some embodiments, the via is inserted into the worked second surface of the semiconductor wafer. In these embodiments, the via may be inserted such that the base of the via is formed by a portion of the first metallization structure or further conductive layer positioned on the first surface of the semiconductor wafer. The conductive material is inserted into the via such that it makes contact with and is electrically connected to the first metallization structure. The conductive material may be electrically insulated from the surrounding device body by insulation material that lines the side walls of the via.

The second metallization layer may be applied to the worked second surface and to the conductive material within the via in order to electrically couple the first electronic device arranged in the first device region to the conductive via and to the second electronic device positioned in the second device region. The second metallization layer may extend from the first device region over the non-device region including the first polymer layer which is exposed in the worked second surface, onto the second device region and onto the conductive material positioned within the via. The second metallization layer may also be structured in order to form one or more contact areas on the worked second surface of the semiconductor wafer that are electrically separated from a further conductive area, for example, the conductive area electrically coupling the first electronic device to the conductive via.

In these embodiments, a vertical portion of the redistribution structure of the module is formed which is positioned within the semiconductor material of the semiconductor wafer, either within the first device region or within the second device region.

In other embodiments, this vertical portion of the redistribution structure may be positioned between the first and second device regions and be positioned in the non-device region. In some embodiments, the method further includes inserting conductive material into the trench formed in the non-device region and electrically coupling the conductive material positioned within this trench to the first electronic device and to the second electronic device. The conductive material within the via may be electrically coupled to the first electronic device and to the second electronic device by portions of the first metallization layer arranged on the first surface and by portions of the second metallization layer arranged on the second surface.

The conductive material arranged in the trench in the non-device region may be electrically insulated from the semiconductor material of the first and second device regions by applying one or more insulating layers to the sidewalls of the trench. In some embodiments, after the first polymer layer is inserted into the trench formed in the non-device region, a via is formed in the first polymer layer in the non-device regions. The via may have a width which is less than the width of the trench such that side faces of the first device region and of the second device region bounding the via are covered with the first polymer layer. The conductive material is applied to the first polymer layer in the via. The first polymer layer is, therefore, used to electrically insulate the conductive material from the side faces of the first and second device regions.

In some embodiments, the portions of the second surface of the wafer are subsequently removed exposing not only the first polymer layer arranged in the non-device regions but also the conductive material arranged within the non-device region in the worked second surface such that the conductive material extends from the first metallization surface structure arranged on the first surface of the second device region to the worked second surface.

The second metallization layer may be applied to the conductive material within the via arranged in the non-device region to electrically couple the first electronic device to the second electronic device. The second metallization layer may be applied such that it extends from the first device region over the non-device region to the second device region. In the case of via being positioned in the non-device region, the lateral extension of the second metallization layer onto both the first and the second device regions may be used to assist mechanical stability of the structure.

In some embodiments, a conductive via from the first surface of the semiconductor wafer to the worked second surface of the semiconductor wafer is formed by a conductive portion of the first device region or of the second device region. The conductive portion extends from the first surface of the semiconductor wafer to the worked second surface of the semiconductor wafer. The conductive portion may be insulated from the remainder of the semiconductor material of the first device region and second device region by an insulation layer, for example an oxide or nitride and/or by the first polymer layer. The conductive portion may be coupled to the first electronic device and second electronic device by a portion of the first and second metallization layers in order to electrically couple the first and second electronic devices and form the circuit.

The first polymer layer may be applied to the first surface of the semiconductor wafer such that at least a portion of the first metallization structure is uncovered by the first polymer layer. In some embodiments, the first polymer layer may be selectively applied such that it is applied to the trenches, edge regions of the component positions and edge regions of the first device regions and of the second device regions or may be applied as a closed layer, and portions of the first polymer layer removed to expose at least portion of the first metallization structure.

In some embodiments, the first polymer layer is laterally arranged such that peripheral portions of the first metallization structure are covered by the first polymer layer and bound exposed portions of the first metallization structure, for example bound and define one or more contact pads. In these embodiments, the first polymer layer may act to control the lateral extent of solder applied to the contact pads.

In some embodiments, the method further comprises applying a carrier to the first polymer layer arranged on the first surface, the first polymer layer being structured such that a least first portion of the first metallization structure is exposed by the first polymer layer. Cavities may be formed between the carrier and the first metallization structure which are bounded by the first polymer layer. The portions of the second surface of the semiconductor wafer are then removed and portions of the first polymer layer in the separation regions and in the non-device regions revealed whilst the carrier is applied to the first polymer layer. The carrier is not in direct contact with the first metallization structure of the semiconductor wafer.

The separation line, for example sawing line, may have a width that is less than the width of the trench in the separation regions. The separation line may then be inserted into the separation region such that at least portions of the side faces of the plurality of separate semiconductor modules comprise a portion of the first polymer layer.

In some embodiments, a second polymer layer is applied to the worked second surface in the separation regions and non-device regions, the side faces of the separate semiconductor modules may also comprise of a portion of the second polymer layer as well as the first polymer layer. The entire side faces as well as edges of the component positions may be covered by the first and second polymer layers.

The second polymer layer may also comprise a curable polymer composition, for example a thermosetting resin, for example, for example a second epoxy layer. The second polymer layer may be applied to the worked second surface such that it covers at least the first polymer layer arranged on the separation regions. The second polymer layer may also cover at least portions of the second metallization layer. In some embodiments, the second polymer layer covers peripheral regions of discrete portions of the second metallization layer and defines one or more contact pads which may be connected to a further conductive surface by solder.

In some embodiments, the second metallization layer includes a portion which extends from the first device region to the second device region and which extends over the non-device region which may comprise the first polymer layer. In some embodiments, the second polymer layer may abut this device connection portion of the second metallization layer or may cover peripheral edge regions of this portion of the second metallization layer and define a contact pad which is exposed from the second polymer layer. In other embodiments, this device connection portion of the second metallization layer may be entirely covered by the second polymer layer which provides electrical insulation of this portion of the metallization layer. This arrangement may be used if an electrical contact directly to this portion of the second metallization layer is not required or in embodiments in which electrical insulation of this portion of the layer and circuit is desirable or required.

In some embodiments, the second metallization layer may be applied by applying a conductive seed layer to the worked second surface, applying a second polymer layer to the seed layer such that at least portions of the seed layer are exposed from the second polymer layer, and applying a conductive layer to the exposed portions of the seed layer. The seed layer may be applied using vacuum deposition techniques, such as sputtering or chemical vapour deposition. The conductive layer may be applied to the seed layer using electrodeposition techniques, such as electroless deposition or galvanic deposition.

The conductive seed layer may be applied to the worked second surface such that the first polymer layer arranged in the separation regions and in the non-device regions and semiconductor material of the first and second device regions are covered by the seed layer. The second epoxy layer may be applied to the seed layer such that the separation regions are covered by the second polymer layer and such that regions of the worked second surface comprising semiconductor material and the first polymer layer arranged in the non-device regions are uncovered by the second polymer layer. The conductive layer is than applied to the seed layer in the portions uncovered by the second polymer layer in order to form the second metallization layer.

At least two devices are fabricated on the wafer so that the distances between chips can be reduced and are limited only by separation processes, for example 10-50 µm for mechanical half-cut dicing or plasma half-cut dicing. The multi-chip die is encapsulated in epoxy and only the corresponding connections are open metallic surfaces, for example copper surfaces. With the help of a via, direct connection between front side 1 (source1) and back-side 2 (drain2) of different chips are possible. Due to the encapsulated nature of the multi-chip die it can be directly picked and placed in standard packages like QFN or in chip embedding approaches.

Different types of devices may be processed next to each other on a silicon wafer. Once the processing of the front-side of the chips has been completed, a half-cut process step is performed. Here, the individual chips or devices are isolated from each other. At the same time the lines for separation between the individual multi-chip dies or multi-device modules are also half-cut. Following a dice-before-grind-with-epoxy process, the chips and half-cut lines (depth of half-cut~wafer target thickness +10 um) are covered and filled with epoxy. The copper pads on the front side are then opened in a lithography step making use of the corresponding epoxy properties. After mounting the wafer on a glass carrier, the wafer is thinned to its desired thickness, for example 15-20 µm. In the thinning process the epoxy filled half-cuts are exposed on the backside. Now a Copper back-side is deposited. This may be achieved by a sputtered Ti/Cu seed layer that is brought to a final thickness via electrodeposition of copper. Depending on the thickness also only sputtering is possible. Afterwards, the copper backside is structured in a manner that the multi-chip dies are connected to form the intended circuit.

The silicon through via can thereby be formed from the front-side before the half-cut dicing or from the back-side before the seed layer deposition. After the Cu backside structuring the complete backside is covered with epoxy again and the intended copper pads are opened in a lithography step making use of the corresponding epoxy properties. After the curing of the epoxy, the wafer is frame-demounted and the multi-chip dies are separated by a laser cut through the epoxy. Now the multi-chip dies can be picked in a standard manner from a dicing foil to be placed in standard packages.

Alternatively, both the copper front-side and copper-backside contacts and the silicon through via can be formed by using the corresponding front- and backside epoxy as a pattern plating mask on the pre-structured seed layer. This is achieved with the help of electroless plating. In this way the silicon through via can be integrated in a preexisting process flow.

The concept can be applied straight forwardly to integrate passive components like capacitors or inductors if they are formed on part of the wafer next to the corresponding connection chips. These passive components are treated like additional chips or as a part of one of the multi-chip system. Integration of these passive components may be of interest in integrated solutions since it allows the minimization of loop inductances and stray passive component contributions. This directly improves the performance of the solution and allows better control of overshoot behavior.

Figure 2:
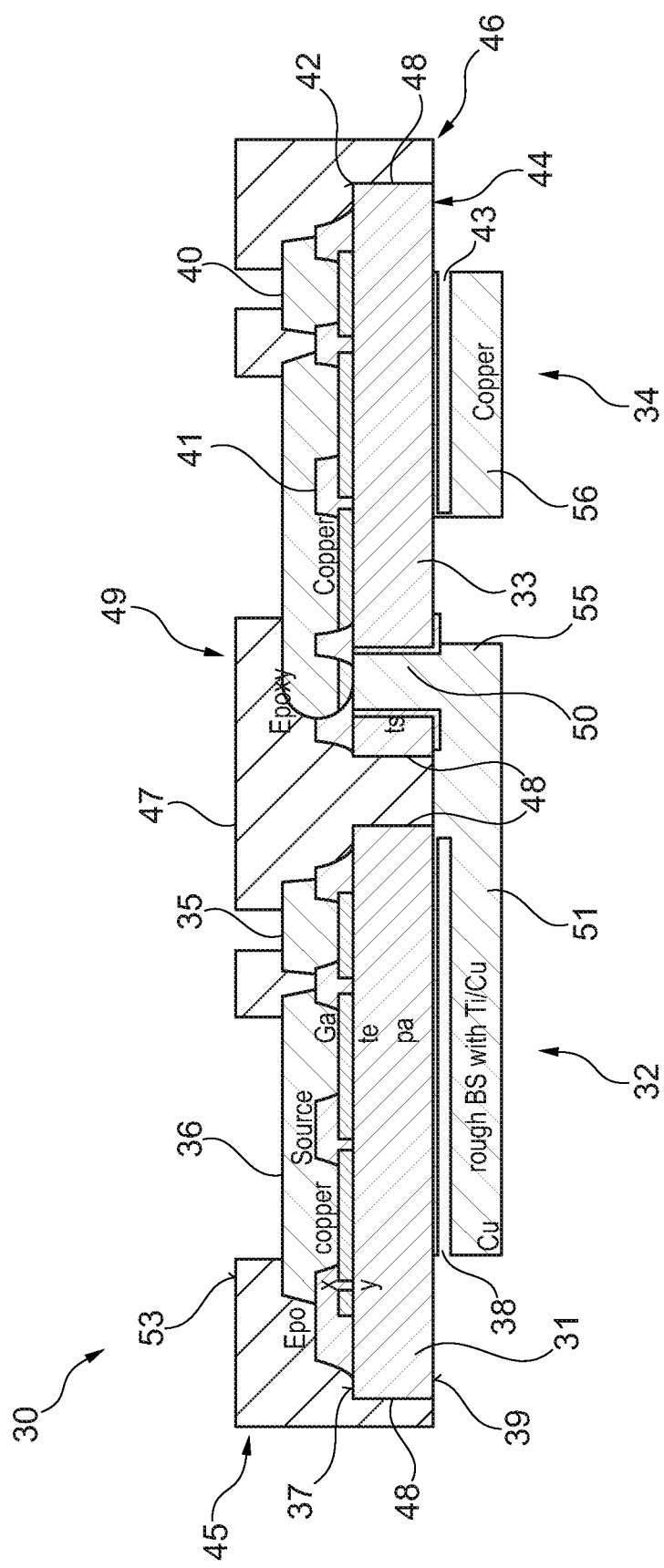
FIG. 2 illustrates a schematic cross-sectional view of a semiconductor module.

FIG. 2 illustrates a schematic cross-sectional view of a semiconductor module 30. The semiconductor module 30 includes a first electronic device 31 in a first device region 32 and a second electronic device 33 in a second device region 34. The first electronic device 31 is operably connected to the second electronic device 33 to form a circuit. In the illustrated embodiment, the first electronic device 31 is a transistor device, in particular a vertical transistor device, having a gate pad 35 and source pad 36 on a first surface 37 and a drain pad 38 on a second surface 39 which opposes the first surface 37. The second electronic device 33 is also a transistor device, in particular a vertical transistor device having a gate pad 40 and source pad 41 on a first surface 42 and a drain pad 43 on a second surface 44 that opposes the first surface 42. The first surface 42 of the second electronic component 33 is substantially coplanar with the first surface 37 of the first electronic component 31 and the second surface 44 of the second electronic component 33 is substantially coplanar with the second surface 39 of the first electronic component 31.

The module 30 has a first major surface 45 which includes at least one contact pad. In the embodiment illustrated in FIG. 2, the first major surface 45 includes four contact pads which are coupled to the source pad 36 and gate pad 35 of the first electronic device 31 and to the gate pad 40 and source pad 41 of the second electronic device 33. The semiconductor module 30 also includes a second major surface 46 that opposes the first major surface 45. The semiconductor module 30 includes a first polymer layer 47, in particular, a first epoxy layer, that is arranged on the first major surface 45 and which leaves at least portions of the contact pads 35, 36, 40, 41 exposed.

The first polymer layer 47 may be arranged on peripheral regions of the contact pads 35, 36, 40, 41. The first polymer layer 47 covers side faces 48 of the first electronic device 31 and the second electronic device 33 such that the first electronic device and the second electronic device 33 can be considered to be embedded in the first polymer layer 47. The semiconductor module 30 also includes a conductive redistribution structure 49 that electrically couples the first electronic device 31 to the second electronic device 33.

In this embodiment, the conductive redistribution structure 49 includes a conductive via 50 which extends from the first major surface 45 to the second major surface 46 of the semiconductor module 30. The conductive via 50 may be positioned in with the first device area 32 or in the second device area 34 and may be called a through silicon via. The conductive via 50 may be electrically insulated from the semiconductor material of the electronic device by an insulation layer 55. The via 50 provides an electrically conductive connection from the first major surface 45 to the second major surface 46 of the module and from the first surface 42 of the second electronic device 33 to the second surface 39 of the first electronic device 32. The redistribution structure 49 further includes a conductive layer 51 that extends laterally on the second major surface 46 of the module and is arranged on the via 50 formed in the second electronic device 33.

The conductive layer 51 is arranged on the conductive via 50 and on a portion of the first polymer layer 47 which forms part of the second major surface 46. The conductive layer 51 extends from the drain pad 38 of the first electronic device 31 to the conductive via 50 and is positioned not only on the first electronic device 31 and a portion of the first polymer layer 47 but also on a portion of the second major surface 44 of the second electronic component 33.

The conductive via 50 may extend between the source pad 41 and the second surface 44 of the second electronic component 33 and be electrically coupled to the source pad 41. The conductive layer 51 in combination with the conductive via 50 provides a redistribution structure 49 from the source pad 41 of the second electronic device 33 to the drain pad 38 of the first electronic device 31. In this particular embodiment, this arrangement can be used to form a half bridge configuration in which the first electronic component 31 is the low side switch of the half bridge configuration and the second electronic device 33 is the high side switch of the half bridge configuration.

A further conductive layer 56 may be arranged on the drain pad 43 of the second electronic device 33 such that the outer surfaces of the further conductive layers 51, 56 are substantially coplanar.

The conductive layer 51 that extends from the second surface 39 of the first electronic device 31 onto the second surface 44 of the second electronic device 33 is electrically insulated from further conductive portions arranged on the second surface 44 of the second electronic device 33, such as the contact pad 56, and from the body of the second electronic device 33 by the insulating layer 55. The insulating layer 55 lines the side walls of the via 50 and extends over and is arranged directly on the second surface 44 of the second electronic device 33 in regions adjacent the via 50. The insulating layer 55 has a lateral extent such that it is positioned between the second surface 44 and the conductive layer 51 and electrically insulates the conductive layer 51 from the second surface 44 and the second surface 44 of the second electronic device 33 from the second surface 39 of the first electronic device 31.

The module 30 may be fabricated using the method illustrated in FIG. 1 whereby the first electronic component 31 is formed from the first device region and the second electronic component 33 is formed from the second device region of the semiconductor wafer. The region between adjoining side faces 48 of the first and second electronic components 31, 33 is the non-device region of the component position of the semiconductor wafer. The outermost surface 53 of the semiconductor module 30 is formed by portions of the first polymer layer 47 which are formed by insertion of the separation line in the separation regions of the semiconductor wafer.

The semiconductor module 30 is formed from a semiconductor wafer by insertion of trenches and filling of the trenches with a first polymer layer which is arranged so as to embed at least the side faces of the electronic devices 31, 33 in the first polymer layer 47. The first polymer layer 47 provides a mechanical matrix holding the electronic devices 31, 33 together. The conductive connection between the electronic devices 31, 33 to form the desired circuit, in the embodiment illustrated in FIG. 2, a half bridge configuration can be formed by deposition of conductive layers on the first and second major surfaces 45, 46 and in the case of one or more vertical devices, by the provision of one or more conductive vias 50 extending between the major surfaces 45, 46 of the semiconductor module 30.

The via 50 may be arranged in a device region. In the embodiment illustrated in FIG. 2, the via 50 is arranged in the second electronic component 33 and extends between the first surface 42 and second surface 44 of the second electronic component 33.

Figure 3A:
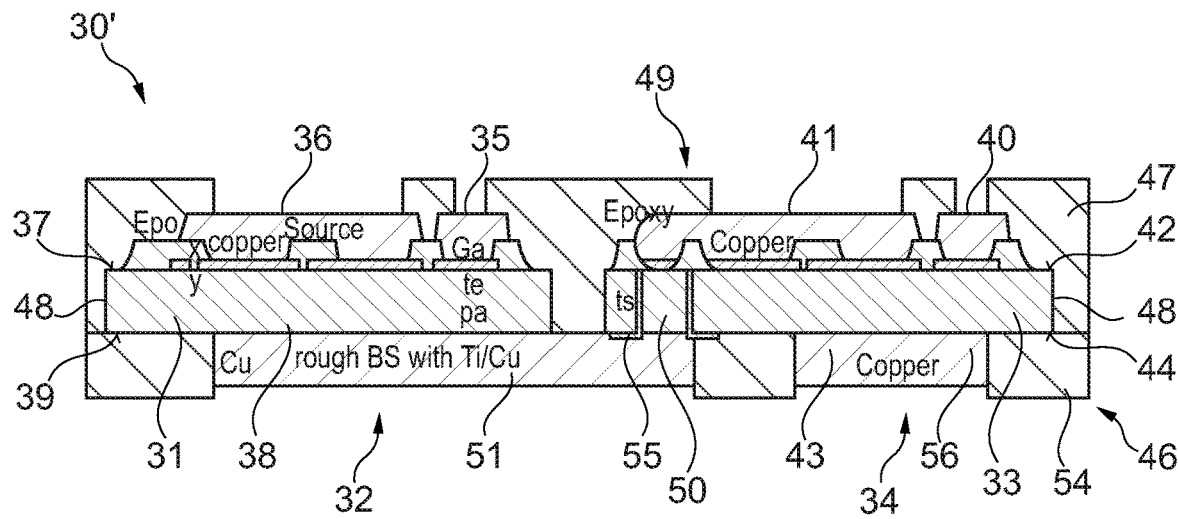
FIG. 3A illustrates a cross-sectional view of a semiconductor module including two polymer layers.
Figure 3B:
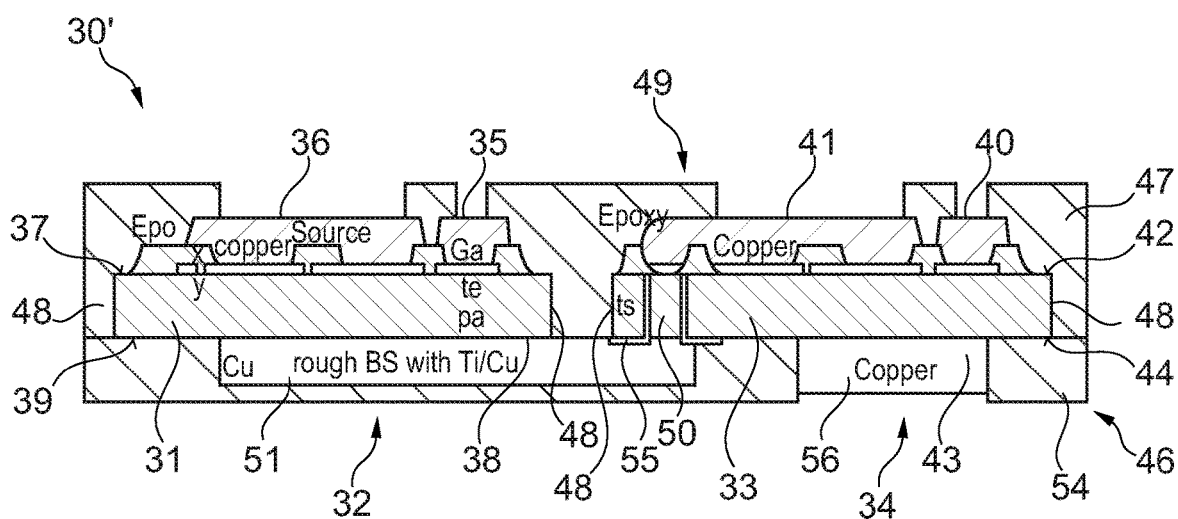
FIG. 3B illustrates a cross-sectional view of a semiconductor module including two polymer layers.

FIGS. 3A and 3B illustrate a cross-sectional view of a semiconductor module 30' which in addition to the features illustrated in FIG. 2 further includes a second polymer layer 54 arranged on the second major surface 46 of the semiconductor module 30'. The second polymer layer 54 may also be a curable polymer, such as a thermosetting polymer composition and in some embodiments includes an epoxy resin.

In some embodiments, such as that illustrated in FIG. 3A, the second polymer layer 54 may be arranged at the peripheral edges of the semiconductor module 30' and be arranged in contact with portions of the first polymer layer 47 arranged adjacent the side faces 48 of the first electronic component 31 and of the second electronic component 33. The second polymer layer 54 may also be arranged between conductive regions of the second major surface 46 of the semiconductor module 30'. For example, in the embodiment illustrated in FIG. 3A, the second polymer layer is arranged between the further layer 51 and the drain pad 43. In some embodiments, the second epoxy layer 54 may cover the peripheral regions of the drain pad 43 and the conductive layer 51.

In some embodiments such as that illustrated in FIG. 3B, the conductive layer 51 is covered entirely by the second polymer layer 54 and at least a portion of the drain pad 43 remains uncovered by the second polymer layer 54.

In the embodiments illustrated in FIGS. 2 and 3, the first electronic device 31 and the second electronic device 33 is a transistor device and the circuit formed is a half bridge circuit. However, the types of electronic devices arranged in the first and second device regions of the semiconductor module are not limited to transistor devices. For example, one of the electronic devices may be a transistor device and the other of the electronic devices may be a driver device, for example a gate driver device, or part of a gate driver device such as a pull-down FET, for driving the gate of the transistor device, or a diode or passive device such as an inductor, a capacitor or a resistor. Furthermore, the module is not limited to including just two electronic devices and may include three or more electronic devices. For example, the module may include two transistor devices coupled to form half bridge circuit, and also a driver device, or part of a gate driver device such as a pull-down FET, for driving the gates of the two transistor devices.

As mentioned above, in embodiments in which the module includes a redistribution structure having a vertical portion extending between the first major surface and the second major surface of the module, the vertical portion may be provided by one or more conductive vias which are positioned in one or more of the electronic devices. In these embodiments, the sidewalls of the via are formed by the semiconductor material, for example silicon, of the electronic device. In other embodiments, the vertical portion of the redistribution structure may be positioned laterally adjacent the electronic devices.

Figure 4:
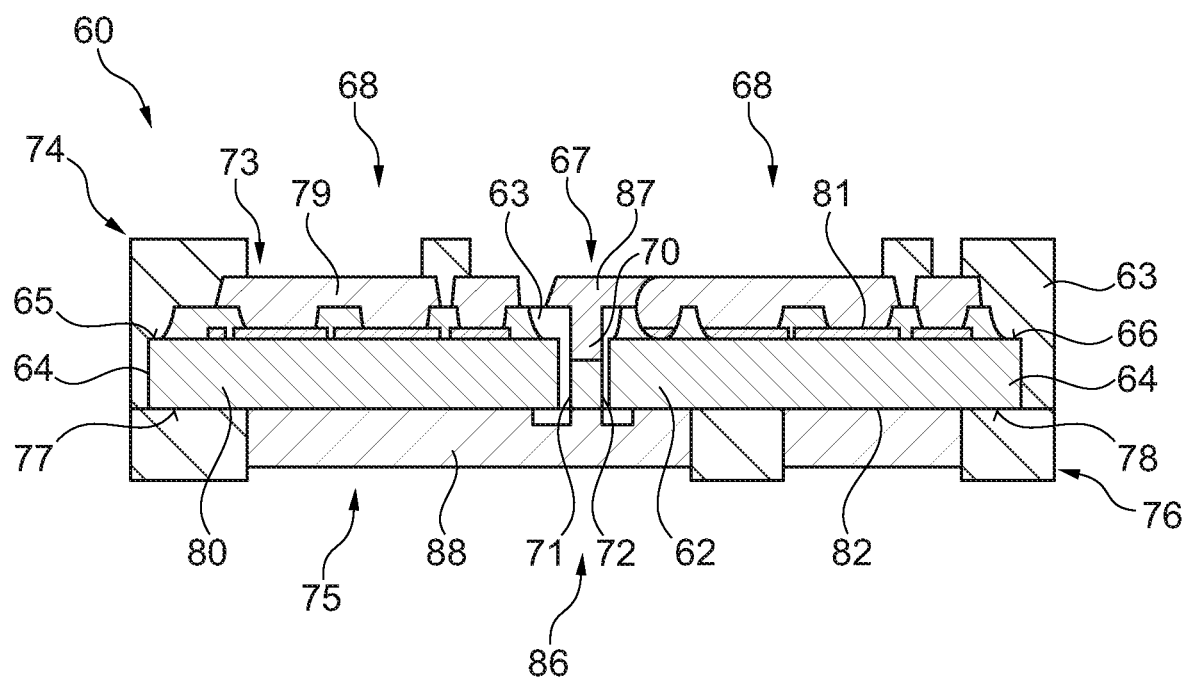
FIG. 4 illustrates a cross-sectional view of a semiconductor module.

FIG. 4 illustrates a module 60 which includes a first electronic device 61 and a second electronic device 62 arranged laterally adjacent each other and embedded in a first polymer layer 63 which covers at least portions of the side faces 64 of both the first electronic device 61 and second electronic device 62. In some embodiments, the first polymer layer 63 may cover peripheral regions and edges of a first major surface 65 of the first electronic device 61 and a first major surface 66 of the second electronic device 62 which is positioned laterally adjacent the first major surface 65 of the first electronic component 61 and may be substantially coplanar with the first major surface 65 of the first electronic component 61. The portion of the first polymer layer 63 arranged between the first electronic device 61 and second electronic device 62 may be described as a non-device region 67 with the first electronic device 61 being arranged in a first device region 68 and the second electronic device 62 being arranged in a second device region 69.

In this embodiment, a conductive via 70 is arranged in the non-device region 67. The conductive via 70 has sidewalls 71 formed by the material of the first polymer layer 63. The conductive via may have an elongate shape in plan view. The conductive via 70 may include conductive material, such as a metal, for example copper. In some embodiments, the side walls 71 defining the via 72 in the first polymer layer 63 may be lined with one or more metal layers which may be used to improve the adhesion to the material of the first polymer layer 63 as well as one or more conductive layers having a thickness suitable for carrying the current required by the particular application. In some embodiments, the via 72 may be substantially filled with conductive material.

The semiconductor module 60 also includes a first metallization structure 73 arranged at the first major surface 74 of the module 60. The first metallization layer 73 may include two or more conductive portions with one or more conductive portions being arranged on the first major surfaces 65, 66 of the first and second semiconductor devices 61, 62. Similarly, the semiconductor module 60 may include a second metallization layer 75 arranged at the second major surface 76 of the module 60 which is structured to provide one or more portions on the second surfaces 77, 78 of the first and second electronic devices 61, 62 respectively. The conductive via 70 may be electrically coupled to a portion of the first metallization structure 73, which extends from one of the electronic devices, for example, the second electronic device 62, to the conductive via 70. The conductive via 70 may be coupled to the other one of the electronic devices, for example the first electronic device 61, by a portion of the second metallization layer 75 arranged on the opposing side of the module 76 which extends between the first electronic device 61 and the conductive via 70.

In the case of the first and second electronic devices 61, 62 being transistor devices and the desired circuit being half bridge configurations, a portion of the second metallization structure 75 may extend from a drain pad positioned at the second surface 77 of the first electronic device 61 to the conductive via 70 and a portion of the first metallization layer 73 may extend from the conductive via 70 to a source pad arranged at the first major surface 66 of the second electronic device 62.

The portion of the second metallization structure 75 that extends from the second surface 77 of the first electronic device 61 onto the second surface 78 of the second electronic device 62 is electrically insulated from further portions of the second metallization structure 75 arranged on the second surface 78 of the second electronic device 62, such as the contact pad 82. This electrical insulation may be provided by an insulating layer 63 that lines the side walls of the via 70 and extends over and is arranged directly on the second surface 78 of the second electronic component 62 in regions adjacent the via 70. The portion of the second metallization structure 75 that is positioned on the second surface 78 of the second electronic device 62 is arranged on this insulation layer 63. The insulation layer 55 also serves to electrically insulate the second surface 78 of the second electronic device 62 from the second surface 77 of the first electronic device 61.

In other embodiments, the conductive layer 75 has a lateral extent such that it does not extend onto the semiconductor body of the first electronic device 61 and extends only to the conductive material in the via 70.

Figure 5:
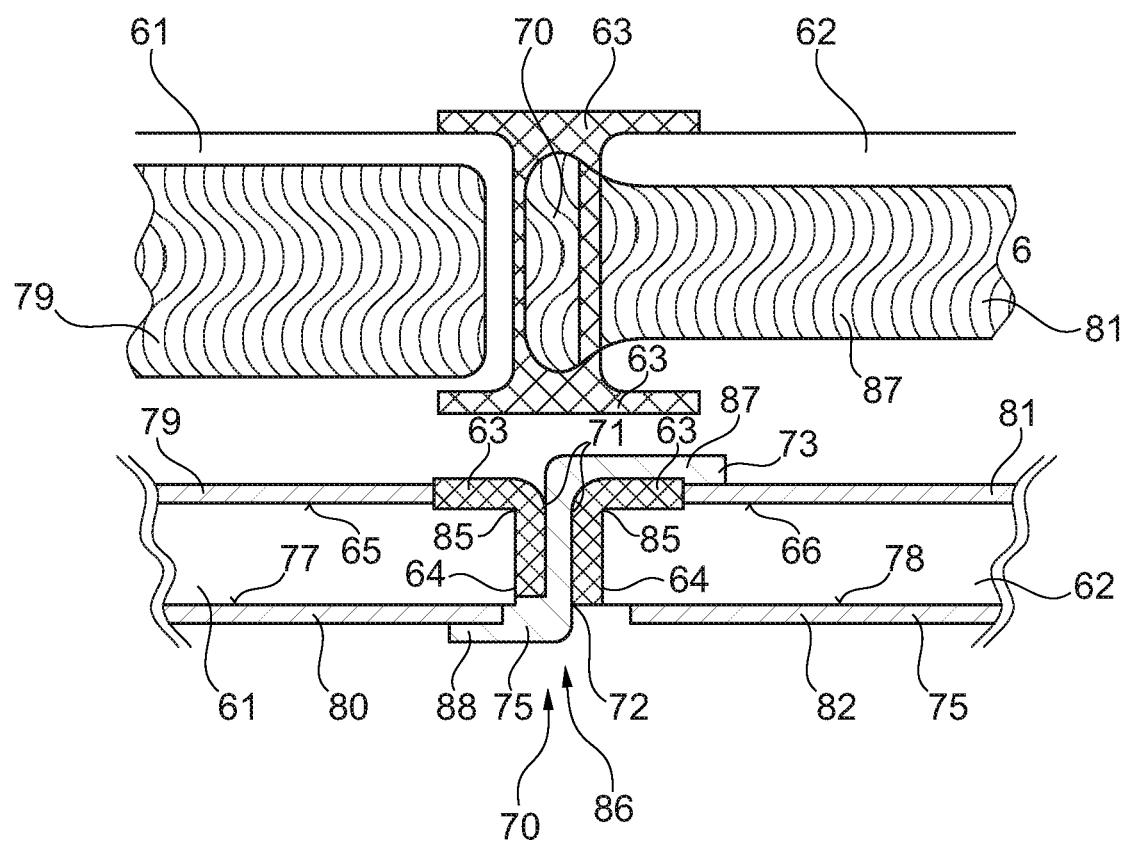
FIG. 5 illustrates an enlarged top view and an enlarged side view of the conductive via of the semiconductor module of FIG. 4.

FIG. 5 illustrates an enlarged top view and enlarged side view of the conductive via 70 in the semiconductor module 60. The first electronic component 61 includes a contact pad 79 on its first major surface 65 which, may be a source pad if the first electronic component is a transistor device for example, and a second contact pad 80 on its second major surface 77 which may be a drain pad for example. The second electronic component 62 also includes a contact pad 81 on its first major surface 66 and contact pad 82 on its second major surface 78. The contact pad 81 may be a source pad and the contact pad 82 may be a drain pad if the second electronic component is a transistor device. Each transistor device may also include a gate pad which cannot be seen in the views of FIG. 5. Edge regions 83 of the first electronic device 61 that are formed between the first major surface 65 and the side face 64 are covered by a portion 84 of the first polymer layer 63. The entire side face 64 of the first electronic component 61 may be covered by the first polymer layer 63. Similarly, the edge region 85 of the second electronic device 62 formed between the first major surface 66 and side face 64 may be covered by the first polymer layer 63. The first polymer layer 63 may abut the contact pads 79, 81 arranged on the first major surfaces 65, 66 of the first and second electronic devices 61, 62, respectively.

The redistribution structure 86 used to couple the contact pad 80 with the contact pad 81 arranged on the opposing sides of the module 60 may be formed by a conductive path which extends from the contact pad 80 through the via 72 to the contact pad 81 to electrically couple the drain of the first electronic device 61 to the source of the second electronic device 62. The redistribution structure 86 includes a via 72 formed in the first polymer layer 64 which extends substantially parallel to side faces 64 of the first and second electronic devices 61, 62. The via 72 may have sidewalls 71 which are roughened to improve the adhesion to the conductive material positioned within the via 72. The sidewalls 71 of the via 72 may also be a lined with one or more adhesion layers. The redistribution structure 86 may be formed using several portions. For example, the conductive via 72 extending through the first polymer layer 63 may be filled with conductive material and a lateral layer 87 applied to the upper surface of the via 70 which extends from the via 70 to the contact pad 81. A second lateral layer 88 may be applied to the opposing rear side of the module 60 which extends from the contact pad 80 to the lower surface of the conductive via 70. In other embodiments, a conductive layer may be applied which extends from the contact pad 81 into the via 72 and by a layer which extends from the contact pad 80 into the via 71 such that the two conductive layers join at a position in the via 72 adjacent the side faces 64 and a continuous conductive path is produced.

The semiconductor module according to any one of the embodiments described herein may be used to form a circuit by mounting the module onto a higher level substrate including a redistribution structure, for example a circuit board such as a printed circuit board. In other embodiments, the semiconductor module may be packaged. Packaging the semiconductor module enables the module to be provided in the form of a package with a standard footprint and standard outline which may assist in simplifying use of the module in particular application.

Figure 6:
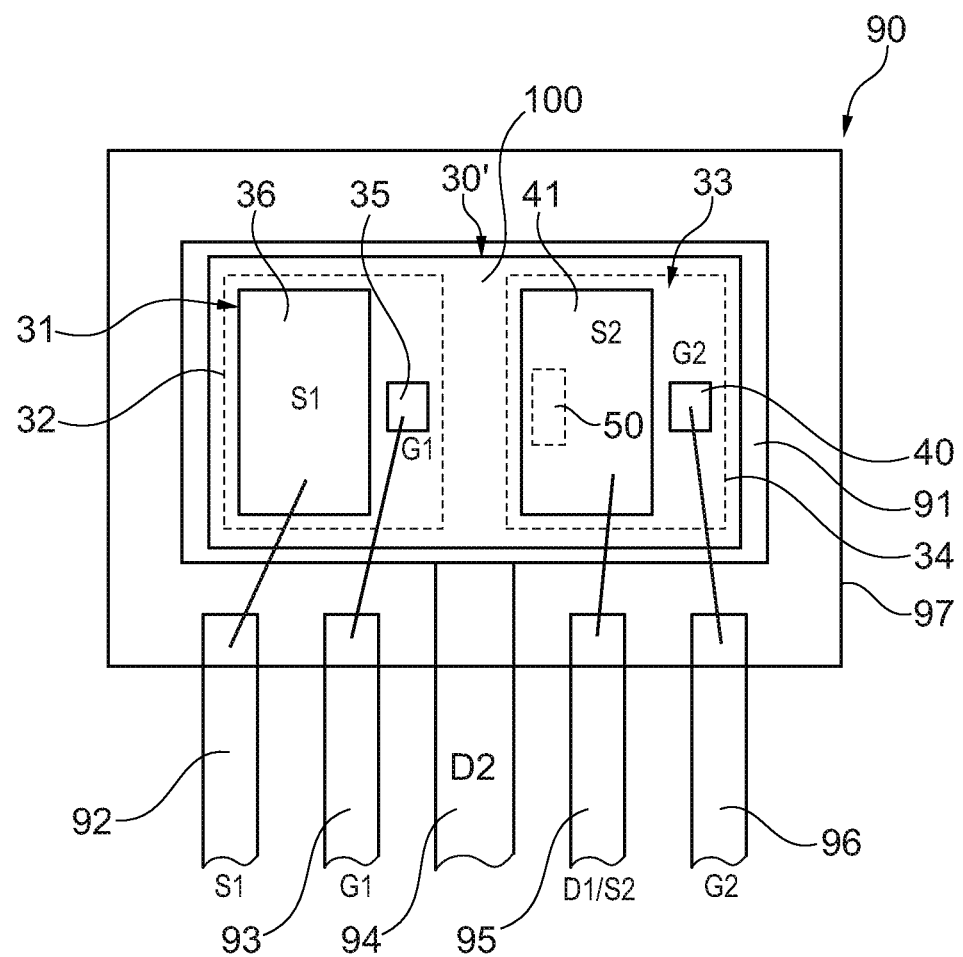
FIG. 6 illustrates a schematic view top view of the semiconductor module of FIGS. 3A-3B accommodated within a package.

FIG. 6 illustrates a schematic view top view of the semiconductor module 30' of FIG. 3B accommodated within a package 90. In the illustrated embodiment, the package 90 includes a die pad 91, five leads 92 to 96 and a plastic housing 97. The die pad 91 and inner portions of the leads 92 to 96 are positioned within the plastic housing 97. Portions of the leads 92 to 96 extend outside of plastic housing 97 and provide the external contact contacts to the package 90. In this embodiment, the leads 92 to 96 are positioned adjacent a single side of the die pad 91 with the central one of the five leads, lead 94, being integral with the die pad 91. The module 30' is mounted on the upper surface 98 of the die pad 91.

Since the drain pad 43 of the second electronic device 33 is exposed at the second major surface 46 of the semiconductor module 30' and the drain pad 38 of the electronic device 61, the further conductive layer 51 and conductive via 50 are covered by the second polymer layer 54, by mounting the second major surface 46 of the module 30' to the upper surface 98 of the die pad 90, the drain pad 43 of the second electronic device 33 may be electrically coupled to the die pad 91 and therefore the central lead 94. The pads 35, 36, 40, 41 arranged at the first major surface 45 of the module 30' face upwardly and may be electrically coupled to the leads 92, 93, 95, 96, which are spaced apart from the die pad 91, by conductive connections such as one or more bond wires, conductive ribbons or contact clips. The source pad 36 may be coupled to the first lead 92, the gate pad 35 may be coupled to the lead 93, the source pad 41 and the gate pad 40 of the second electronic device 33 may be coupled to the leads 95, 96 respectively.

Also illustrated in the top view of FIG. 6 is the non-device area 100 of the module 30'. The device areas 32, 34 are indicated by dashed lines. The conductive via 50 is positioned underneath the source pad 41 and is also indicated by a dashed line.

The package is not limited to one having the arrangement of die pad, leads, connections and housing illustrated in FIG. 6. For example, the package may be a Surface Mount Device, such as a Super SO8 package or QFN (Quad Flat No Lead) package. A contact clip may be used in place of bond wires for power connections, e.g. connections other than a connection to the gates, for example.

A method for fabricating a semiconductor module according some embodiments will now be described with reference to FIGS. 7A to 7I.

Figure 7C:
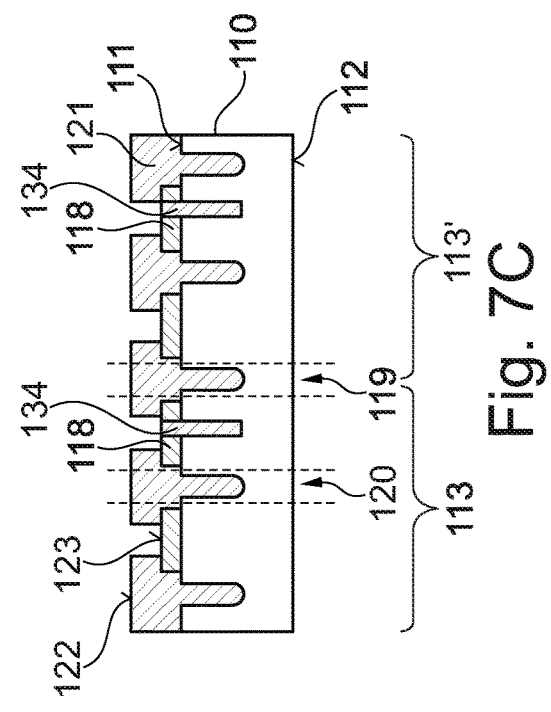
FIG. 7C illustrates the wafer after application of a first polymer layer.
Figure 7D:
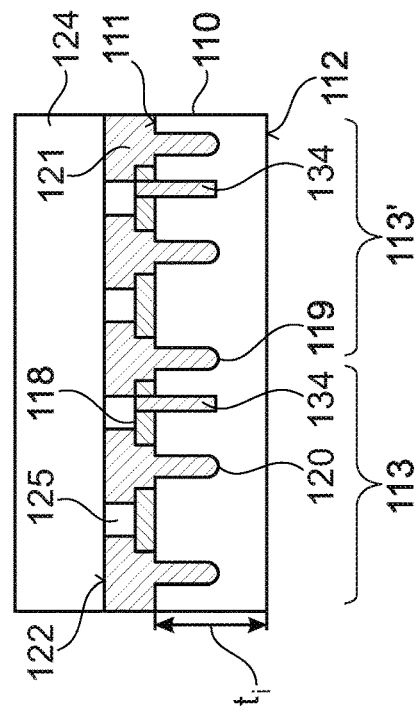
FIG. 7D illustrates the wafer after application of a carrier.
Figure 7A:
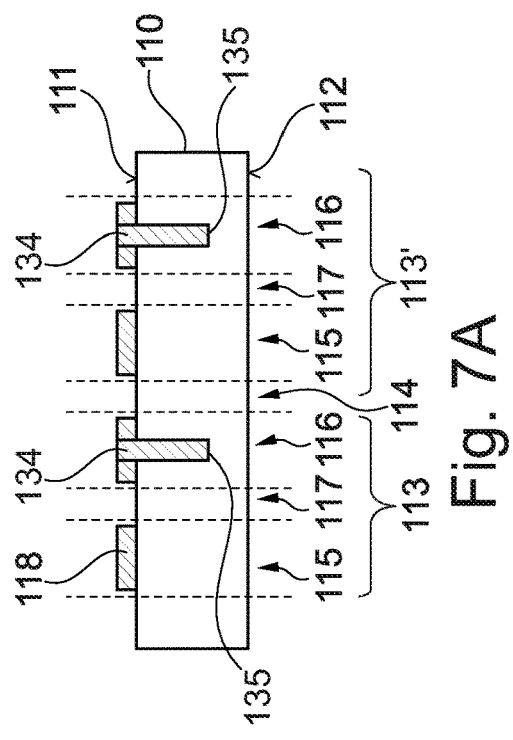
FIG. 7A illustrates a cross-sectional view of a semiconductor wafer.

FIG. 7A illustrates a cross-sectional view of a semiconductor wafer 110 including a first major surface 111 and a second major surface 112 which opposes the first major surface 111. The semiconductor wafer 110 includes a plurality of component positions of which two component positions 113, 113' are illustrated in FIGS. 7A to 7I. Adjacent component positions are spaced apart from one another by a separation region 114. The semiconductor wafer 110 may comprise silicon and may be a silicon single crystal wafer or a silicon single crystal wafer comprising an epitaxial silicon layer on top in which semiconductor devices are formed, whereby the epitaxial layer provides the first major surface 111 and the silicon single crystal wafer provides the second major surface 112.

The component positions 113 are typically arranged in rows and columns to form a regular grid such that the separation regions 114 provide have the form of substantially orthogonal stripes in plan view. Each component position 113 includes two or more device regions 115, 116 which are separated by a non-device region 117 which does not include any device structures. The wafer 110 also includes a first metallization structure 118 on its first major surface 111. The first metallization structure 118 may be structured so that it is positioned in only the device regions 115, 116 and such that the non-device region 117 is free from first metallization structure 118.

Figure 7B:
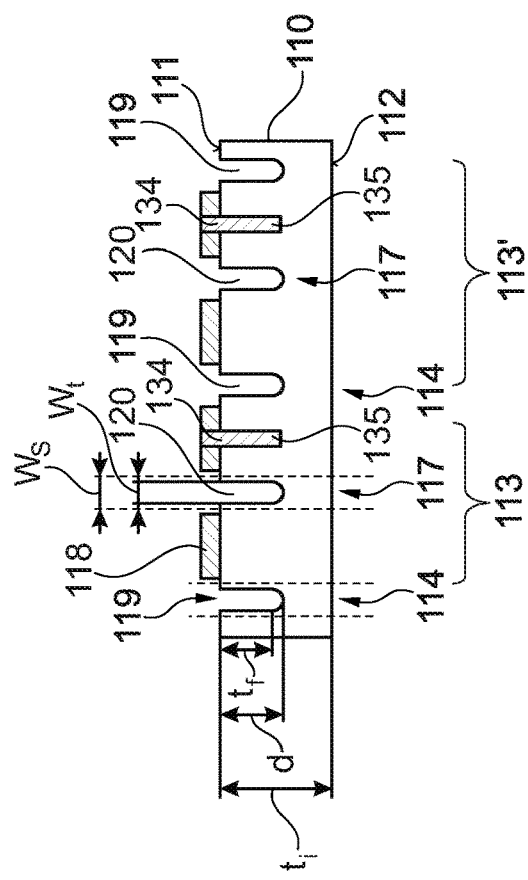
FIG. 7B illustrates the wafer after the formation of first trenches and second trenches in the first major surface of the wafer.

One of the device positions of the component position 113, for example the device regions 116, includes one or more conductive vias 134 which extends from the first metallization structure 118 into the wafer 110 to a depth. The conductive via 134 may have the form of a blind via 135 having a base positioned at a depth from the first major surface 111 which is greater than the predetermined final thickness of the electronic components as is illustrated in FIG. 7B. The blind via 135 may include insulation material (not seen in the figures) that covers at least the side walls of the blind via 135 and conductive material arranged on the insulation material. The conductive material may include one or more liner layers lining the side walls of the blind via and one or more further conductive materials on the liner layers. The conductive material may fill the remainder of the blind via 135. The conductive material may include one or more metals or alloys and/or polysilicon.

FIG. 7B illustrates the wafer 110 after the formation of first trenches 119 which have been inserted into the first major surface 111 in the separation regions 114 and after the formation of second trenches 120 which have been inserted into the first major surface 111 in the non-device regions 117. The trenches 119, 120 may have a depth d which is slightly larger than the predetermined final thickness $t_f$ of the electronic components and which is less than the initial thickness $t_i$ of the wafer 110.

FIG. 7C illustrates the wafer 110 after a first polymer layer 121, which in this embodiment comprises epoxy, has been inserted into the first trenches 119 and second trenches 120. In this embodiment, the first polymer layer 121 also extends over the peripheral regions of the discrete portions of the first metallization layer 118 and therefore has an uppermost outer surface 122 which is positioned in a plane above the outer surface 123 of the first metallization structure 118. In other embodiments, the first polymer layer may abut the portions of the first metallization layer and form a substantially coplanar surface.

FIG. 7D illustrates the wafer 110 after a carrier 124 has been applied to the outer surface 122 of the first polymer layer 121. Since the outer surface 122 of the first polymer layer 121 is arranged at a plane above the outer surface 123 of the first metallization layer 118, cavities 125 are formed between the carrier 124 and the first metallization structure 118.

Figure 7E:
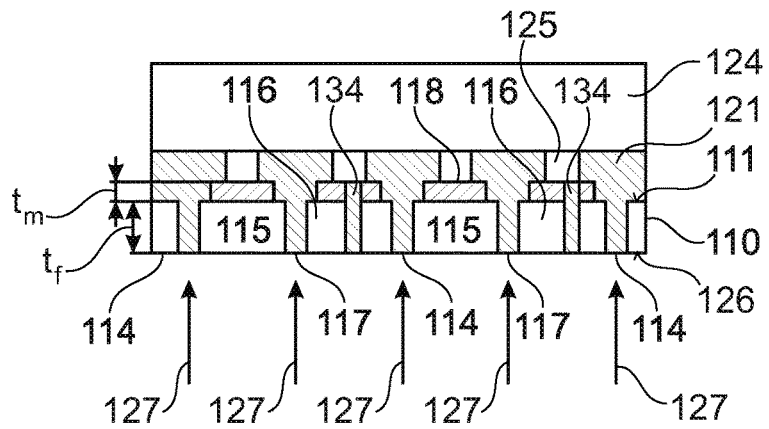
FIG. 7E illustrates the removal of portions of the second major surface of the wafer.

FIG. 7E illustrates the removal of portions of the second major surface 112 of the semiconductor wafer 110 so that the initial thickness $t_i$ of the wafer 110 is reduced to the final desired thickness $t_f$ and such that portions of the first polymer layer 121 arranged in the separation region 114 and in the non-device regions 117 are exposed in the worked second surface 126 and the conductive material arranged in the blind vias 134 in the second device positions 116 is exposed at the worked second surface to produce a through contact or through-silicon-via (TSV). The removal of portions of the wafer 110 is indicated schematically in FIG. 7E by the arrows 127. The portions of the second surface 112 of the semiconductor wafer 110 may be removed by grinding and/or chemical mechanical polishing, for example.

Figure 7F:
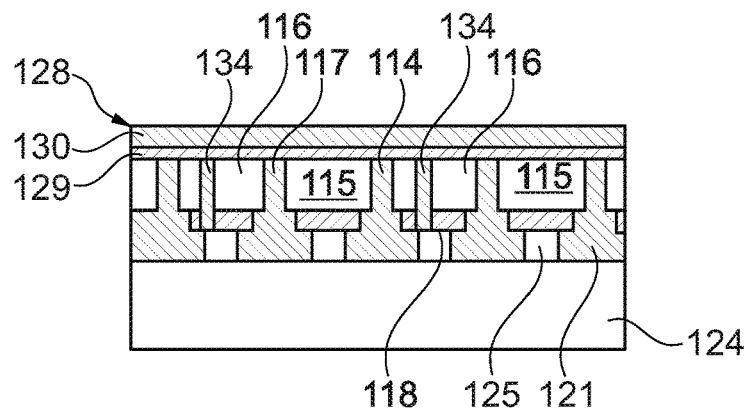
FIG. 7F illustrates the application of a second metallization structure to the worked second surface of the wafer.

FIG. 7F illustrates the application of a second metallization structure 128 to the worked second surface 126. In some embodiments, one or more insulation layers, for example an oxide layer, may be applied to the worked second surface 126 and structured before application of the second metallization structure 128 to the worked second surface. The second metallization layer 128 may include a seed layer 129 and further conductive layer 130 applied to the seed layer 129. The second metallization layer 128 may be applied such that it forms a closed layer extending over the exposed portions of the first polymer layer 121, the worked second surface 131 of the device regions 115, 116 and portions of the conductive material in the vias 134 which are exposed at the worked second surface 126.

Figure 7G:
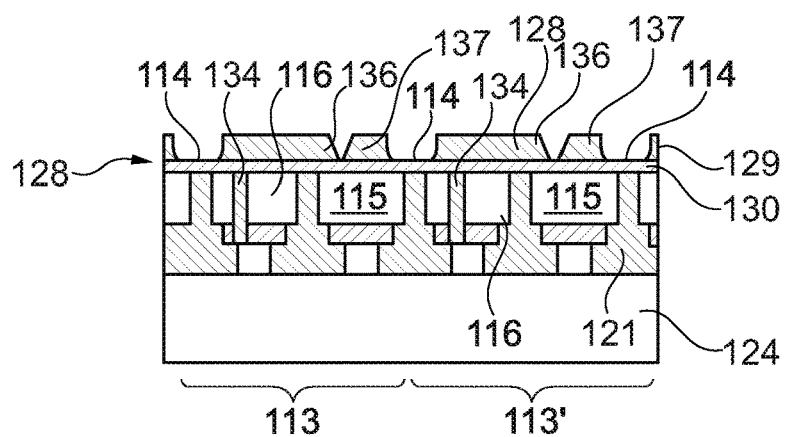
FIG. 7G illustrates the structuring of the second metallization structure.
Figure 7H:
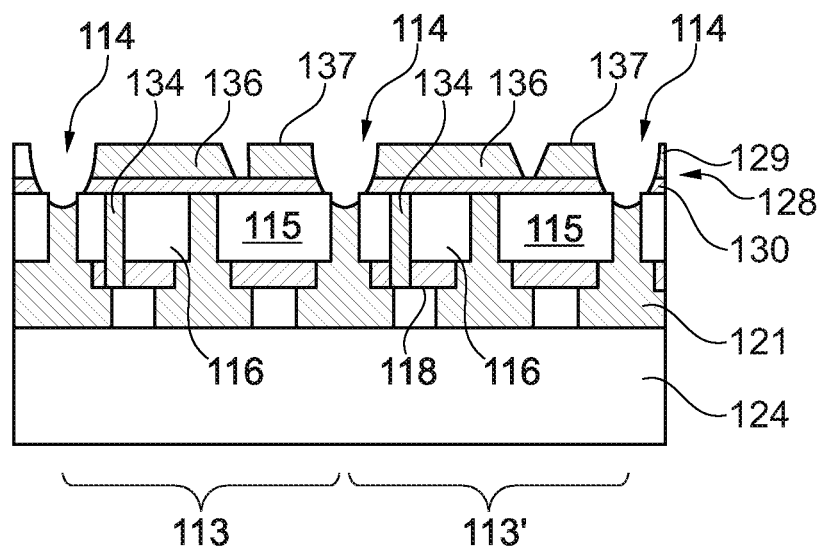
FIG. 7H illustrates the structuring of the second metallization structure.

The conductive layer 130 may be structured as illustrated in FIG. 7G so that the separation 114 regions are free of the conductive layer. The structure of the second metallization layer 128 may be carried out such that an electrical connection between the first device area 115 and the second device area 116 within each component position 113 is formed. One or more further discrete conductive areas may also be formed within one or both of the component positions 113 depending on the desired electrical connections for the circuit.

The conductive via 134 may be electrically coupled to a structured portion 136 of the second metallization layer 128 that extends over the non-device region 117 onto the other device, for example from the second device area 116 to the first device area 115 in the embodiment illustrated in FIG. 7G. One or more further discrete structured portions 137 that are separate from the structured portion 136 may be formed on the first device area 115 and/or second device area 116. The device area including a via may include a discrete portion and a potion that extends onto a neighbouring device area.

Figure 7I:
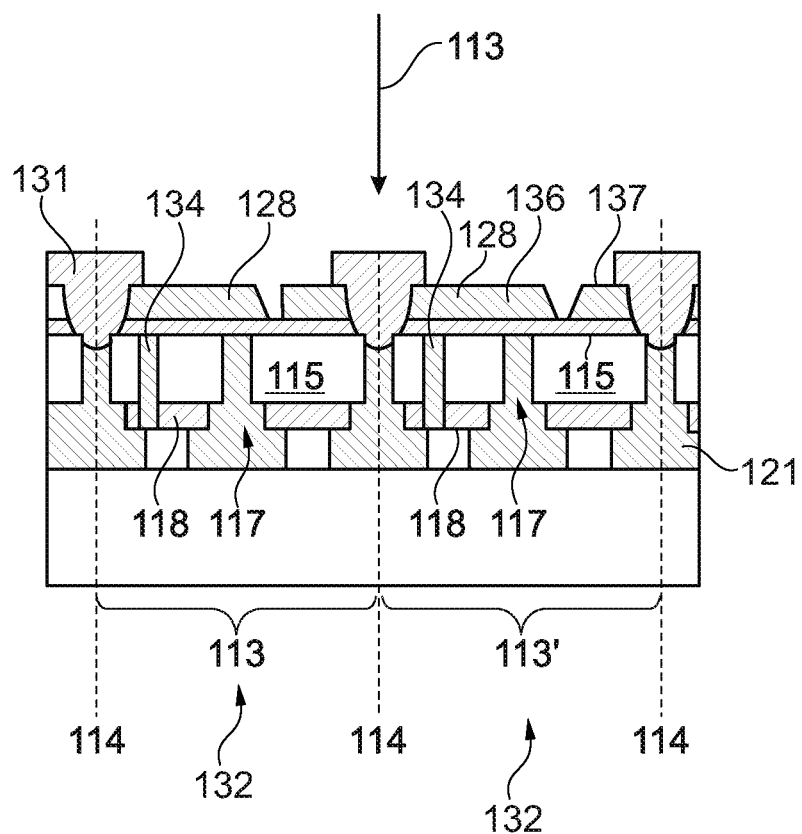
FIG. 7I illustrates the application of a second polymer layer and separation of semiconductor modules.

In some embodiments, a second polymer layer 131 may be applied to the separation regions 114 and non-device regions 117 at the worked second surface 126. In some embodiments, such as that illustrated in FIG. 7H the second metallization layer 128 may be structured such that both the conductive layer 130 and the seed layer 129 and some portions of the first polymer layer 121 arranged at the worked second surface 126 in the separation regions 114 are removed. The second polymer layer 131 may be applied in the separation regions 114 as shown in FIG. 7I such that it is in contact with the first polymer layer 121 and overlaps peripheral regions of the second metallization layer 128 formed in the component positions 113. The interface between the first polymer layer and the second polymer layer 131 may be positioned adjacent sidewalls of the device regions 115, 116. The semiconductor modules 132 may then be singulated from the wafer by inserting a separation line 133, for example by sawing, along the separation regions 114. The width of the separation line may be less than the width of the separation region 114 such that the outermost side faces of the individual modules 132 are covered by the first and second epoxy layers 121, 131.

In some embodiments, the semiconductor module 132 includes a redistribution structure including a vertical portion which extends substantially perpendicular to the first and second lateral major surfaces. As discussed above, this vertical portion may be provided by a conductive via 134 which may be positioned within one or more of the device regions 115, 116 and consequently have sidewalls formed by semiconductor material of the electronic device. Sidewalls of the via may be lined with an insulating material so as to electrically insulate the conductive material within the via from the semiconductor material of the electronic device. The conductive material may include one or more metals.

In other embodiments, the conductive via may be positioned in the non-device region 117 and formed by inserting a further trench in the polymer material in the non-device region 117. Such a conductive via extends substantially parallel to side faces of the adjacent device regions 115, 116. The conductive material within the via is electrically insulated from the semiconductor material of the device regions 115, 116 by the polymer material. The sidewalls of the conductive via are formed by polymer material. This embodiment may be used to manufacture the semiconductor module 60 illustrated in FIGS. 4 and 5.

In some embodiments, the vertical portion of the redistribution structure may be formed by semiconductor material and may be formed by a portion or island of semiconductor material positioned within the device region.

Figure 8:
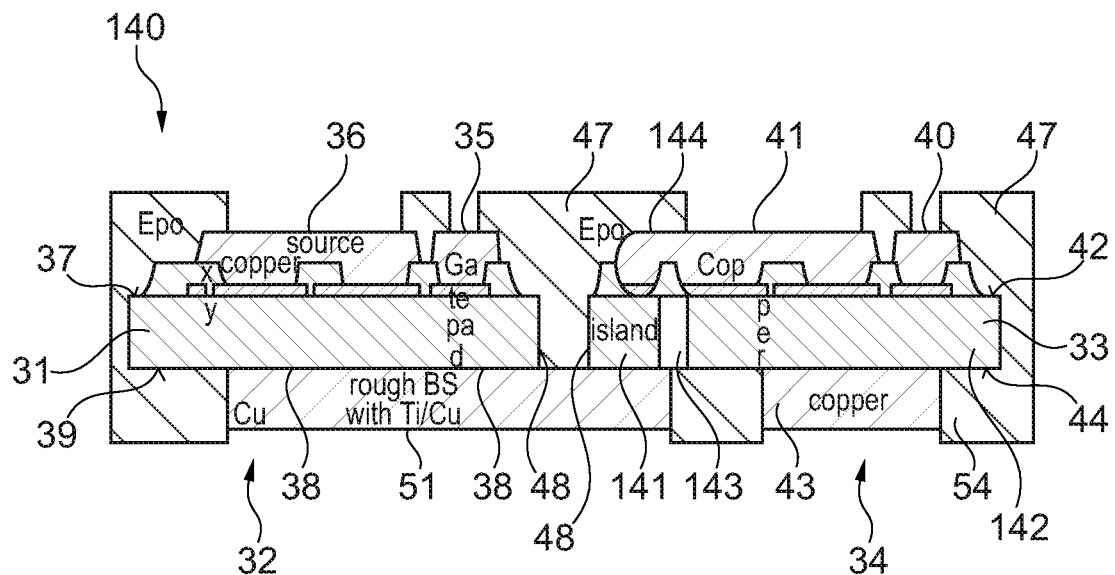
FIG. 8 illustrates a cross-sectional view of a semiconductor module.

FIG. 8 illustrates a cross-sectional view of a module 140 including the first electronic device 31 arranged in a first device region 32 and second electronic device 33 formed in a second device region 34 as in the embodiment illustrated in FIG. 2. The semiconductor module 140 differs in the form of the vertical portion of the redistribution structure between the drain pad 38 on the second surface 39 of the first electronic device 31 and the source pad 41 arranged on the first surface 42 of the second electronic device 33. In this embodiment, the second device region 34 comprises an island 141 of semiconductor material which is electrically insulated from the further semiconductor material 142 of the second electronic device 33 by insulating material 143. The insulation layer 143 extends form the first surface 42 to the second surface 44 to isolate the island 141 from the remainder of the second electronic device 33.

In the embodiment illustrated in FIG. 8, the island 141 is formed at the periphery of the second electronic component 33 and is bounded on at least one side by a portion of the polymer material first polymer layer 47 which is arranged between the side faces 48 of the first and second electronic devices 31, 33.

The island 141 may include a semiconductor material having a conductivity which is higher than the conductivity of the semiconductor material 142 of the electronic device. The island 141 may be more highly doped that the semiconductor material of the electronic device. In embodiments in which the electronic devices 31, 33 are formed from a semiconductor wafer including an epitaxial layer on a substrate, the epitaxial layer may be processed to form the transistor device structures at the first surface 37, 42. The substrate may be highly doped and have a sufficient conductivity for forming the drain region and a portion of the redistribution structure. In these embodiments, the upper epitaxial layer may be removed from the substrate at the upper portion of the island 141 and replaced by material having a higher conductivity in order to form a vertical conductive connection from the first surface 42 to the opposing second surface 44. Alternatively, the conductivity of the epitaxial layer may be locally increased in the island 141 by increasing the doping level, for example, by implantation, a contact extending through the upper epitaxial layer to the underlying substrate or the combination of a contact extending through the upper epitaxial layer and a locally increased doping level may be used.

The conductive island 141 may be electrically coupled to the source pad 41 arranged on the first surface 42 of the second electronic component 33 by a conductive layer 144 which extends between the island 141 and the source pad 41. The conductive island 141 may be electrically coupled to the drain pad 38 arranged on the second surface 39 of the first electronic component 31 by the conductive layer 51 on the opposite side of the island 141 which extends from the drain pad 38 to the island 141. The conductive layer 51 has a lateral extent such that its periphery is arranged on the insulating material 143 and stops short of the semiconductor body of the second electronic device 33 so that it is not arranged on the rear side 44 of the electronic device 33.

In other embodiments, the island may be formed within the semiconductor material of the device region such that it is surrounded on all side faces by the insulating material 143.

A second polymer layer 54 may be arranged on the second surface 39 of the first electronic device 31 and second surface 44 of the second electronic device 33 between the further conductive layer 51 and drain pad 38 and at the periphery of the module. The second polymer layer 54 may also entirely cover the further conductive layer 51.

Figure 9:
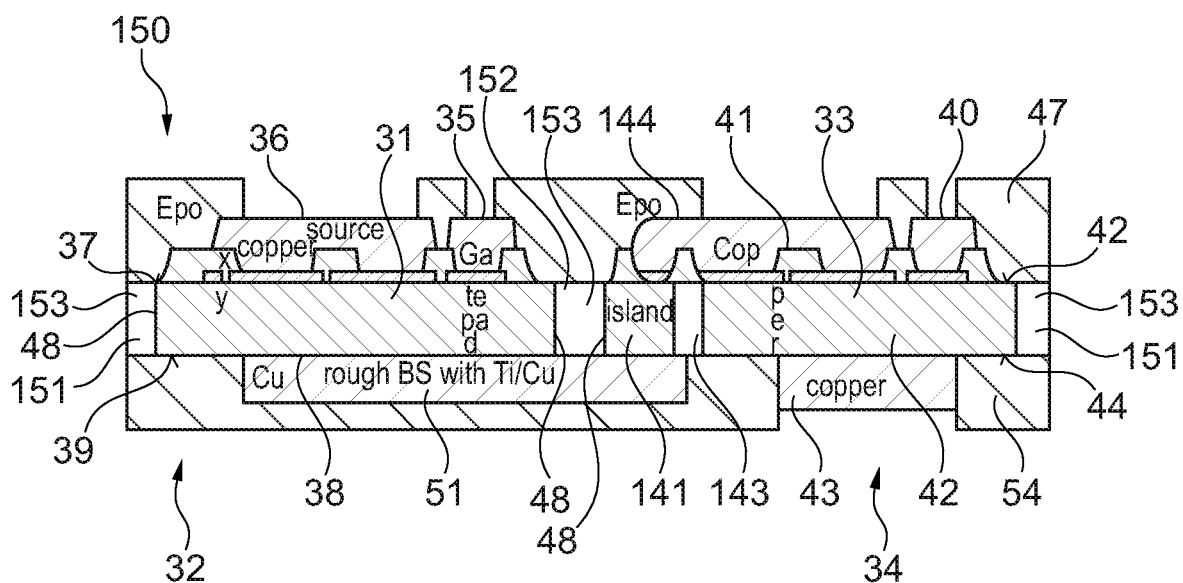
FIG. 9 illustrates a cross-sectional view of a semiconductor module.

FIG. 9 illustrates a semiconductor module 150 which includes a first electronic device 31 arranged in a first device region 32 and second electronic device 33 formed in a second device region 34 as in the embodiment illustrated in FIG. 2. The semiconductor module 150 further includes a redistribution structure between the drain pad 38 on the second surface 39 of the first electronic device 31 and the source pad 41 arranged on the first surface 42 of the second electronic device 33 in the form of a conductive island 141 of semiconductor material as in the embodiment illustrated in FIG. 8. The conductive island 141 is electrically insulated from the further semiconductor material 142 of the second electronic device 33 by insulating material 143.

The semiconductor module 150 differs from the semiconductor module 140 of FIG. 8 in that the separation regions 151 formed between the outermost facing side faces 48 of the device regions 32, 34 of the module 150 and the non-device regions 152 extending between side faces 48 include insulating material 153 which is separate from the first and second polymer layers 47, 54. The insulating material 153 may be the same as or different from the insulating material 143 which electrically insulates the conducive island 141 providing the vertical redistribution structure from the body of the second semiconductor device 33. The insulating material 153 may comprise an oxide or a nitride, such as SiO$_2$ for example.

The insulating material 153 has a thickness which corresponds to the thickness of the first electronic device 31 and the second electronic device 33 and extends from the first surface 37 to the second surface of the first electronic device 31 and from the first surface 42 to the second surface 44 of the second electronic device 33. The first polymer layer 47 is arranged on the insulating material 153 in the separation regions 151 and in the non-device regions 152. The second polymer layer 54 is arranged on the insulating material 153 in the separation regions 151.

The conductive layer 51 extends from the drain pad 38 over the second major surface 37 of the first electronic device 31 and over the insulating material 153 in the non-device region 151. The conductive layer 51 has a lateral extent such that its periphery is arranged on the insulating material 143 which insulates the island 141 from the semiconductor body of the second electronic device 33 and stops short of the semiconductor body of the second electronic device 33 so that it is not arranged on or electrically coupled with the rear side 44 of the electronic device 33.

As in the embodiment illustrated in FIG. 3B, the further conductive layer 51 may be entirely covered by the second polymer layer 54, as illustrated in FIG. 9, or abut the further conductive layer 51, as in the embodiment illustrated in FIG. 8.

To summarize, embodiments described herein, combine advantages of multi-chip dies such as closer chip distances, single picking of multi-chip die, and front-side contacting of gate and sense-pads and can be used to provide a module and electronic component with a desired circuit cost-effectively and efficiently.

In some embodiments, such as those illustrated in FIGS. 2, 3A-3B and 7A-7I, at least one of the semiconductor devices 33 of the semiconductor module 30, 30'; 132 includes a conductive via 50; 134 that includes conductive material positioned in a via or through-hole which extends from the front surface to the rear surface of the semiconductor body of the semiconductor device. The conductive via 50; 134 may be manufactured by inserting the via into the front surface 111 of the semiconductor wafer 110, as in the embodiment illustrated in FIG. 7A. In other embodiments, the conductive via 50; 134 may be formed by inserting the via into the opposing rear surface 112 of the semiconductor wafer 110.

Embodiments for forming a conducive via will now be described with reference to FIGS. 10A to 15 for a semiconductor package that includes a single semiconductor device. These embodiments can, however, also be used for fabricating a conductive via in a semiconductor module including two or more semiconductor devices, for example the module described with reference to FIGS. 1 to 9, whereby one, both or all of the semiconductor devices of the module may include a conductive via.

Figure 10A:
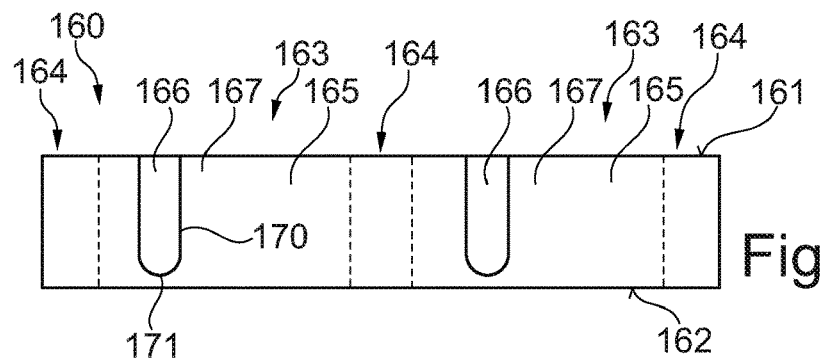
FIGS. 10A to 10F illustrate a method of fabricating a semiconductor package according to an embodiment.

FIG. 10A illustrates a cross-sectional view of a semiconductor wafer 160 including a first major surface 161 and a second major surface 162 which opposes the first major surface 161. The semiconductor wafer 160 may comprise silicon and may be a silicon single crystal wafer or a silicon single crystal wafer comprising an epitaxial silicon layer on top in which semiconductor devices are formed, whereby the epitaxial layer provides the first major surface 161 and the silicon single crystal wafer provides the second major surface 162.

The semiconductor wafer 160 includes a plurality of component positions 163 of which two are illustrated in FIG. 10. The method will be described with reference to a single component position 163. However, in practice, the method is carried out on all of the component positions in the wafer 160. Adjacent component positions 163 are spaced apart from one another by a separation region 164. The component positions 163 are typically arranged in rows and columns to form a regular grid such that the separation regions 164 provide have the form of substantially orthogonal stripes in plan view. Each component position 163 includes a single device region 165 that in this embodiment includes a single semiconductor device 167. The device region 165 may include a power device 167 such as a transistor device, in particular a transistor device with a vertical drift path which is commonly referred to as a vertical transistor device. The vertical transistor device may be a MOSFET device or an IGBT, for example.

A vertical transistor device may have a first power electrode and a control electrode positioned on the first surface and a second power electrode positioned on the opposing second surface. The first power electrode may be a source of a MOSFET device or an emitter of an IGBT device, the second power electrode may be a drain of a MOSFET device or a collector of an IGBT device and the control electrode may be a gate of a MOSFET device or a gate of an IGBT device.

At least one first trench 166 is formed in the first surface 161 of the semiconductor wafer 160 in the device region 165 of the component position 163. The first trench 166 may have an elongate form in plan view or may have a substantially circular or square form in plan view. In some embodiments, a plurality of first trenches may be formed in each component position 163. The first trench 166 has a base 171 and sidewalls 170 and may have a depth which is less than the thickness of the semiconductor wafer 160. The depth of the first trench 166 may also be slightly greater than the intended final thickness of the semiconductor die, for example around 10% deeper than the intended final thickness. The first trench 166 may be formed by etching.

In some embodiments, the first trench 166 has a ratio of width to depth of 0.5:1.0 to 1.5:1.0, for example around 1:1. This ratio may be used to assist in the reliable deposition of conductive material into the first trench 166, for example by electrodeposition.

Figure 10B:
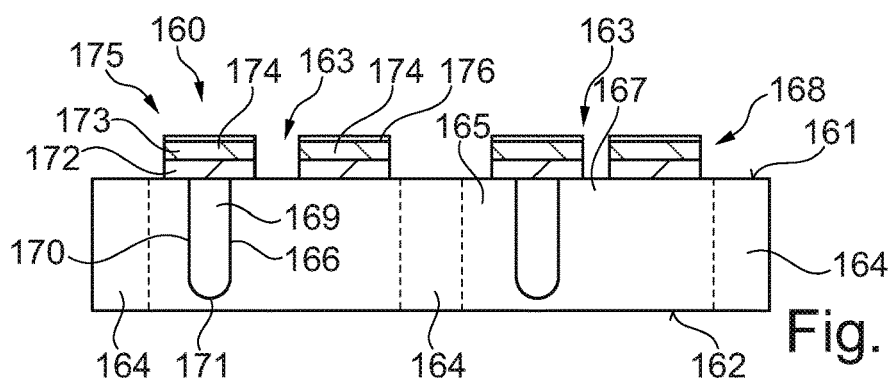

Referring to FIG. 10B, a first metallisation structure 168 is formed on the major first surface 161 and conductive material 169 is inserted into the first trench 166. The conductive material 169 may include one or more sublayers and may fill the first trench 166. In non-illustrated embodiments, the conductive material 169 lines the sidewalls 170 and base 171 of the first trench leaving a gap in the centre. The conductive material 169 may include a plurality of sublayers.

Figure 12:
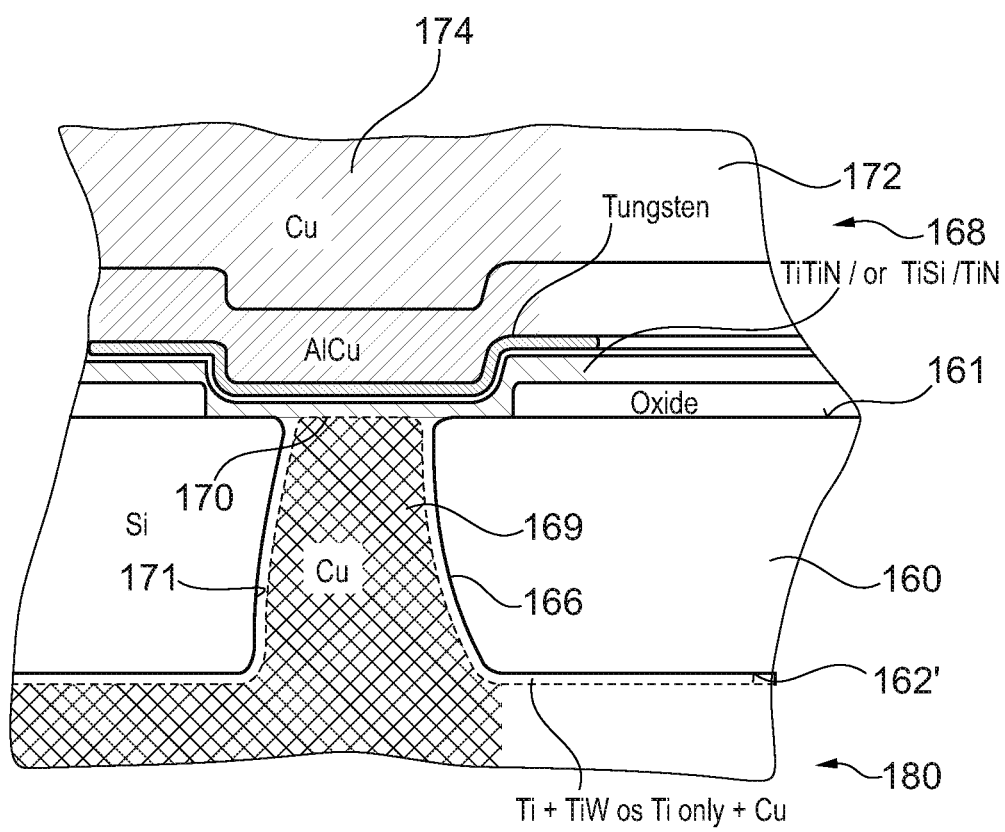
FIG. 12 illustrates an enlarged view of a conductive via for a semiconductor package or a semiconductor module.

The first metallisation layer 168 may include a plurality of sublayers. FIG. 12 illustrates an enlarged view of a structure which may be used for the first metallization structure 168 and illustrates the sublayers. The conductive material 169 which is positioned in the first trench 166 may include the same structure as the first metallization layer.

The structure of the sublayers illustrated in FIG. 12 may also be used to form the first metallization layer of a semiconductor module including two or more devices that are electrically connected together to form a circuit, such as a half-bridge configuration. The structure of the sublayers illustrated in FIG. 12 may also be used to form the first metallization layer of a semiconductor module as illustrated in FIGS. 1 to 9.

The structure of the sublayers positioned in the first trench 166 illustrated in FIG. 12 may also be used for a conductive via in a semiconductor module, whereby the conductive via may be positioned in the semiconductor die, as in the embodiments illustrated in FIGS. 2, 3 and 7 or between semiconductor dies, as in the embodiments illustrated in FIGS. 4 and 5.

In the embodiment illustrated in FIG. 12, the first metallization layer 168 includes sublayers of titanium (Ti), titanium nitride (TiN), tungsten (W), an aluminium copper alloy (AlCu) and copper (Cu) arranged in this order on the first surface 161. In other embodiments, the structure of the first metallisation layer 168 may include sublayers of a titanium silicon alloy (TiSi), whereby the silicon is deposited with the titanium onto the first surface 161, titanium nitride (TiN), tungsten (W), an aluminium copper alloy (AlCu) and copper (Cu). The copper layer may be deposited by a combination of physical vapour deposition (PVD) techniques and galvanic techniques, such as electroplating or electroless plating. In FIG. 10B, two copper layers 172, 173 of the first metallisation structure 168 are indicated. The copper layer 172, which is deposited by PVD, may have a thickness of around 5 μm and the copper layer 173, which is deposited by galvanic techniques, may have a thickness of around 10 μm.

In some embodiments, the conductive material 169 in the first trench 166 may include sublayers of titanium (Ti), titanium tungsten (TiW) and copper (Cu) arranged in this in this order on the sidewalls 170 and base 171 of the first trench 166, or titanium (Ti) and copper (Cu) arranged in this order on the sidewalls 170 and base 171 of the first trench 166. The conductive material 169 may be inserted into the first trench 166 using two or more different processes. For example, the titanium and titanium tungsten sublayers may be deposited by physical vapour deposition (PVD) such as sputtering and the copper may be deposited using galvanic techniques. The copper layer may be deposited by a combination of physical vapour deposition techniques and galvanic techniques. The first trench 166 may also be lined with an insulating layer before deposition of the conductive material 169.

The first metallisation layer 168 provides the outer contacts 174 of the final semiconductor package which form a package footprint 175. In some embodiments, a further protective layer 176 is positioned on the outermost surface of the copper of the first metallization layer 168.

The protective layer 176 may include a material to protect the underlying first metallization layer 168 from oxidation or corrosion, since the metallization layer 168 provides the outer contacts of the final semiconductor package. The protective layer 176 may include a metal or alloy, for example, Sn or Ag in the case of a copper outer layer of the first metallization layer 168, and may also be present in the solder connection formed between the outer contact of the final semiconductor package and a higher level circuit board. The protective layer 176 may also be formed by a soft solder.

Figure 10C:
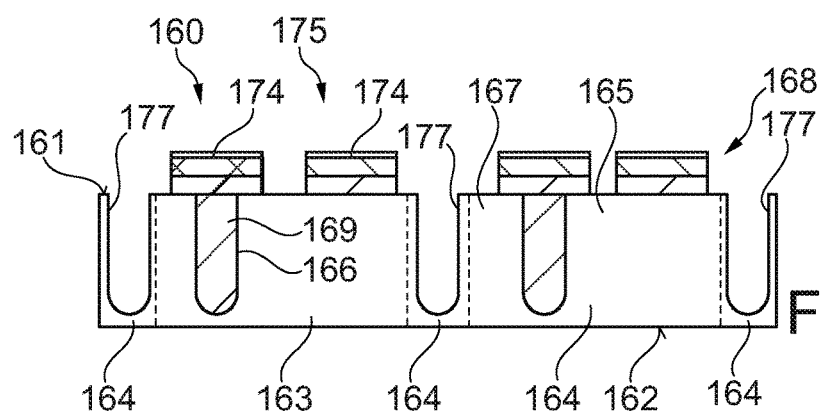

As illustrated in FIG. 10C, a second trench 177 is inserted into the first surface 161 of the semiconductor wafer 160 in the separation regions 164. The second trench 177 has a base positioned within and formed by the semiconductor material of the semiconductor wafer 160. The second trench 177 may have a depth that is slightly greater than the desired thickness of the semiconductor die. The second trench 177 may have approximately the same depth as the first trench 166.

Figure 10D:
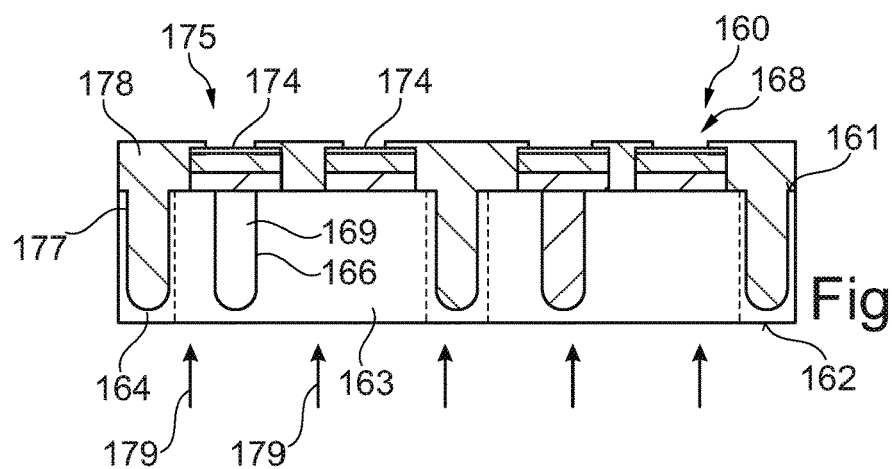

A first polymer layer 178 is applied is applied to the first major surface 161, as illustrated in FIG. 10D, such that the second trench 177 and edge regions of the component positions 163 adjoining the separation regions 164 are covered with the first polymer layer 178. The first polymer layer 178 may include an epoxy resin. In some embodiments, edge regions of the first metallisation layer 168 are also covered with the first polymer layer 178 such that central regions of the protection layer 176 remain exposed from the first polymer layer 178. In these embodiments, the first polymer 178 is used to define the outer contacts 174 and the package footprint 175.

The method then continues by removing portions of the second surface 162 of the semiconductor wafer 160 as indicated by schematically in FIG. 10d by the arrows 179 to reveal portions of the first polymer layer 178 in the separation regions 164 and the conductive material 169 in the first trenches 166 and produce a second worked surface 162'. The first side 161 of the semiconductor wafer 160 may be mounted onto a carrier such as glass and the second surface 162 removed by grinding and/or chemical mechanical polishing to reduce the thickness of the semiconductor wafer 160 to the desired thickness. The desired final thickness may be in the range of 5 μm to 60 μm, for example, 15 to 30 μm.

Figure 10E:
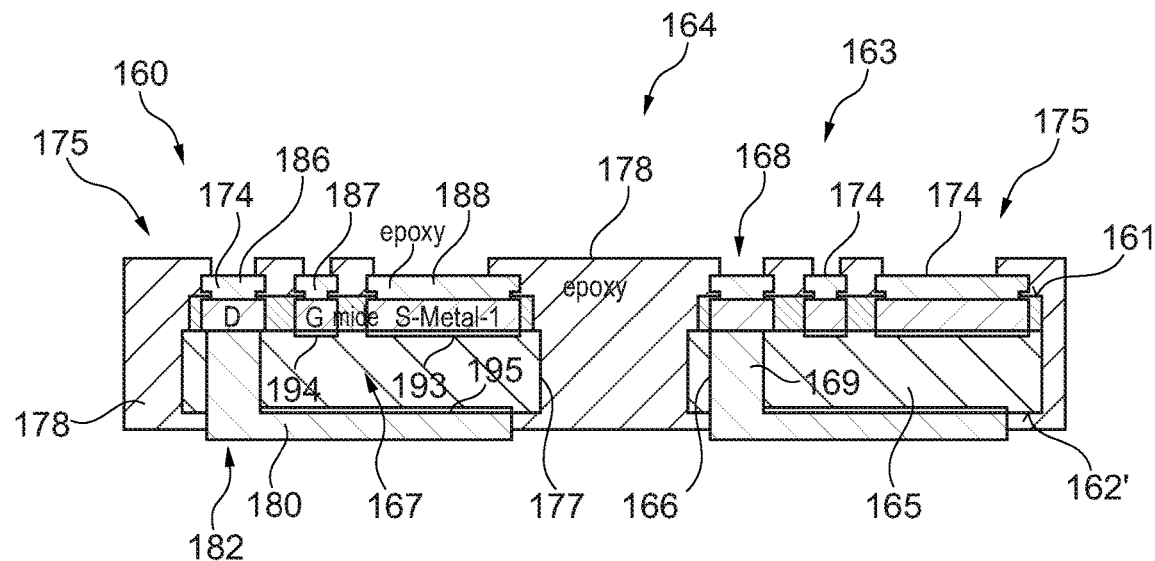

A second metallisation layer 180 is applied to the second worked surface 162' as illustrated in FIG. 10e. Since the second metallisation layer 180 is in direct contact with the conductive material 169 in the first trenches 166, the second metallisation layer 180 is operably coupled to the conductive material 169 in the first trench 166 and to an outer contact pad 174 on the first major surface 161. The second metallisation layer 180 may also include a plurality of sublayers, such as titanium, and copper. The copper may be deposited using two different techniques, for example a physical vapour deposition technique may be used to deposit a first copper layer which may act as a seed layer and the further copper layer deposited onto the first copper layer by galvanic techniques. A protective layer may also be positioned on the copper layer. The protective layer may be silver or tin for example. In some embodiments, the protection layer applied to the second metallization layer 180 may be electrically insulating as the second metallization layer 180 does not provide an outer contact in the final semiconductor package.

In embodiments in which the device 167 is a vertical transistor device, the second metallisation layer 180 is coupled to the drain region of the transistor device and the conductive material 169 within the first trench 166 provides a vertical conductive path or via 182 from the drain region to the contact pad 174 which provides the drain outer contact 186 of the semiconductor package.

The semiconductor packages 183 are separated from the wafer 160 by cutting through the first polymer layer 178 positioned on separation regions 164 and, in particular, through the first polymer layer 178 positioned in the second trenches 177. Side faces 184 of the final second semiconductor packages 183 may be coated by the first remaining portions of the first polymer layer 178 in embodiments in which the width of the cut inserted into the second trench 177 is less than the width of the second trench 177. The resulting semiconductor package 183 is illustrated in FIG. 10f.

Figure 10F:
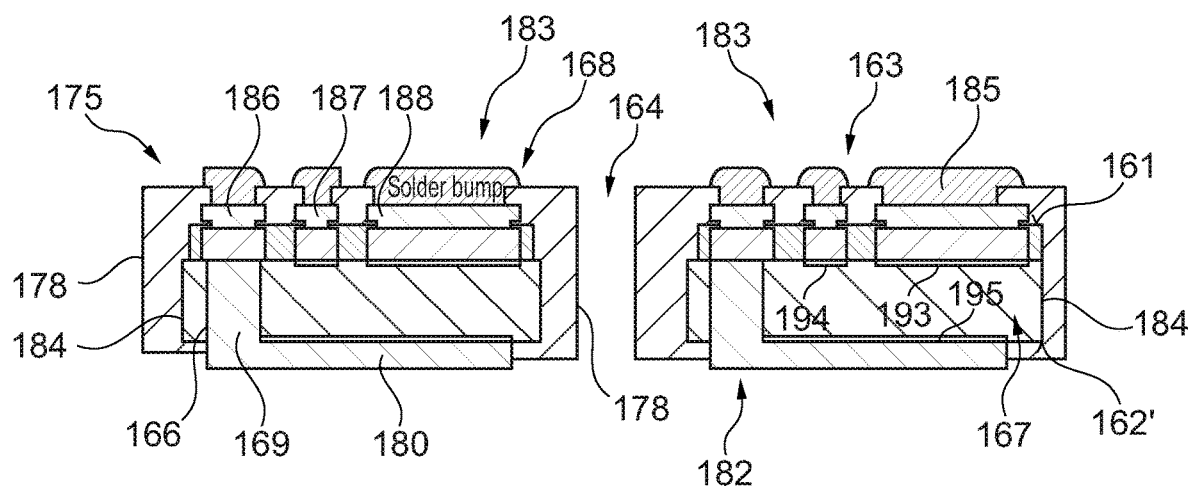

In FIGS. 10E and 10F, a cross-sectional view of the semiconductor wafer 160 is illustrated in which the drain outer contact 186, a gate outer contact 187 and a source outer contact 188 of the semiconductor package 183 can be seen. The source electrode 193 and gate electrode 194 arranged on the first surface 161 of the component position 163 and transistor device 167 and the drain electrode 195 arranged on the second surface of the component position 163 and transistor device 167 are also illustrated in the cross-sectional view of FIGS. 10E and 10F.

In some embodiments, a second insulating layer which may include a polymer such as an epoxy resin is applied to the worked second surface 162' after the formation of the second metallization layer 180 and before singulation of the packages 183 from the wafer 160 as is described in connection with the fabrication of the semiconductor module with reference to FIG. 7I.

In some embodiments, solder 185 is applied to the outer surfaces of the outer contacts 174. The solder 185 may be applied before separation of the semiconductor packages 183 from the semiconductor wafer 160. In some embodiments, the protective layer 176 of the first metallisation layer 168 may be omitted and the solder 185 may act as the protective layer.

The semiconductor packages 183 may be singulated or separated from the wafer 160 by laser cutting through the first polymer layer 178 and then removed from the dicing tape by a pick and place machine and placed into a carrier real for delivery to the customer. Electrical testing of the packages 183 may be carried out before singulation.

In some embodiments, a semiconductor package 183 is, therefore, formed that comprises a first transistor device 167. The first semiconductor device 163 comprises a first surface 161 and a second surface 162' opposing the first surface 161, a first power electrode, for example a source electrode, and a control electrode, for example a gate electrode, arranged on the first surface 161 and a second power electrode, for example a drain electrode, arranged on the second surface 162'. The semiconductor package 183 includes a first metallization structure 168 arranged on the first surface, the first metallization structure 168 comprising a plurality of outer contact pads 186, 187, 188, the outer contact pads 186, 187, 188 comprising a protective layer 176 of solder, Ag or Sn. The semiconductor package 183 further comprises a second metallization structure 180 arranged on the second surface 162', a conductive connection 169 extending from the first surface 161 to the second surface 162' and electrically connecting the second power electrode to an outer contact pad 186 of the first metallization structure 168. A first epoxy layer 178 is arranged on side faces 184 and on the first surface 161 of the transistor device 163, the first epoxy layer 178 comprising openings defining the lateral size of the outer contact pads 186, 187, 188 and the package footprint 175.

In some embodiments, the semiconductor package further comprising a second epoxy layer on the second surface 162', wherein the second epoxy layer covers edge regions of the second surface 162' and leaves a region of the second metallization layer 180 exposed, or the second epoxy layer entirely covers the second metallization layer 180.

In the method illustrated with reference to FIGS. 10A-10F, the first trenches 166 used for fabricating the conductive via 182 and the second trenches 177 used for separating the semiconductor packages 183 from the wafer 160 are both introduced into the wafer 160 from the first side 161. In an alternative embodiment, the second trenches 177 are inserted into the first major surface 161 of the semiconductor wafer 160 and the first trenches 166 are introduced into the semiconductor wafer 160 from the second side 162 of the semiconductor wafer 160. The first trenches 166 are introduced into the semiconductor wafer 160 after processing of the first side is completed and after the semiconductor wafer 160 has been thinned, the worked second surface 162' has been formed and the polymer layer 178 positioned in the second trenches 177 has been exposed in the worked second surface 162'. This embodiment will be described with reference to FIGS. 11A-11D.

Figure 11A:
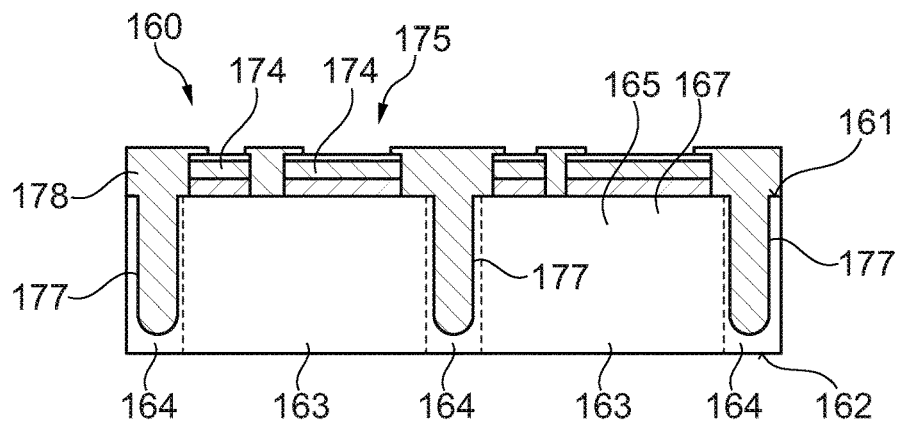
FIGS. 11A to 11D illustrate a method of fabricating a semiconductor package according to an embodiment.

FIG. 11A illustrates the semiconductor wafer 160 including the first major surface 161 and the second major surface 162 opposing first major surface 161. The wafer 160 includes the component positions 163 separated by separation regions 164 with the semiconductor device 167 being positioned in the device region 165 of the component position 163.

The first metallisation structure 168 is formed on the first surface 163 of the semiconductor wafer 160 on the component positions 163 and is structured to produce a plurality of outer contacts 174 forming package footprint 175. The first metallization structure 168 may have the structure illustrated in FIG. 12. The second trench 177 is then formed in the first surface 161 of the semiconductor wafer 160 in the separation regions 164 and the first insulating layer 178, which includes an epoxy, is applied to the first surface 161 such that it fills the second trenches 177. The first polymer layer 178 may further extend over the peripheral edge regions of the component positions 163 and, in some embodiments, may also extend over peripheral regions of the first metallisation layer 168 and, therefore, peripheral regions of the outer contacts 174 of the package footprint 175 provided by the first metallisation layer 168.

Figure 11B:
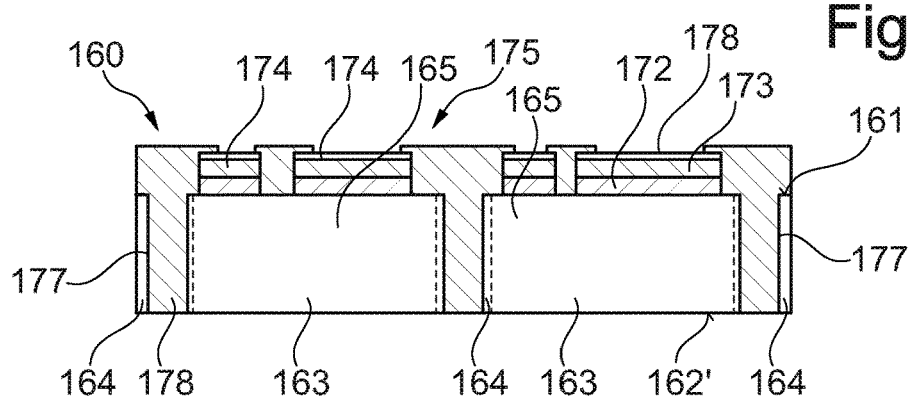

As illustrated in FIG. 11B, portions of the second surface 162 of the semiconductor wafer are then removed, revealing portions of the first polymer layer 178 positioned in the second trenches 177 of the separation regions 164. The first surface including the first polymer layer 178 may be mounted on a carrier, such as a glass carrier and the second surface 162 is removed by grinding and/or chemical mechanical polishing to reduce the thickness of the semiconductor wafer 160 to the desired final thickness, which may lie in the region of 5 to 60 µm, and produce the second worked surface 162'.

Figure 11C:
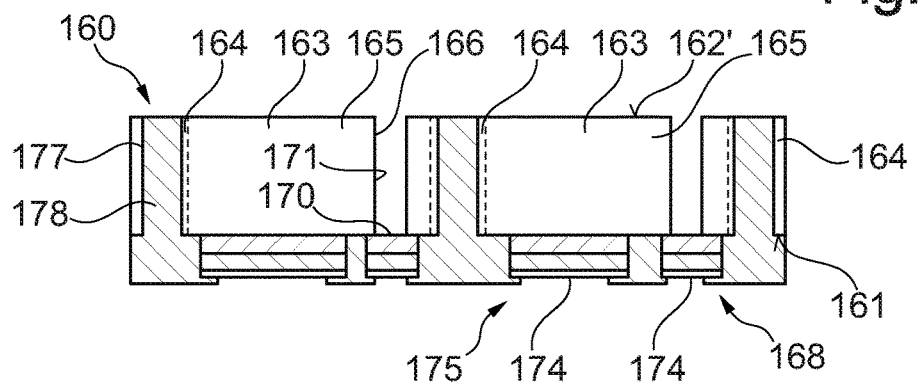

As illustrated in FIG. 11C, the first trench 166 is inserted into the worked second surface 162' in the device regions 165 of the component positions 163. This first trench 166 is used for forming the vertical conductive connection between the worked second surface 162' and the first surface 161 of the semiconductor wafer 160. The first trench 166 has a depth such that it has a base 170 formed by the first metallization layer 168. The first trench 166 extends throughout the entire thickness of the thinned semiconductor after 160.

Figure 11D:
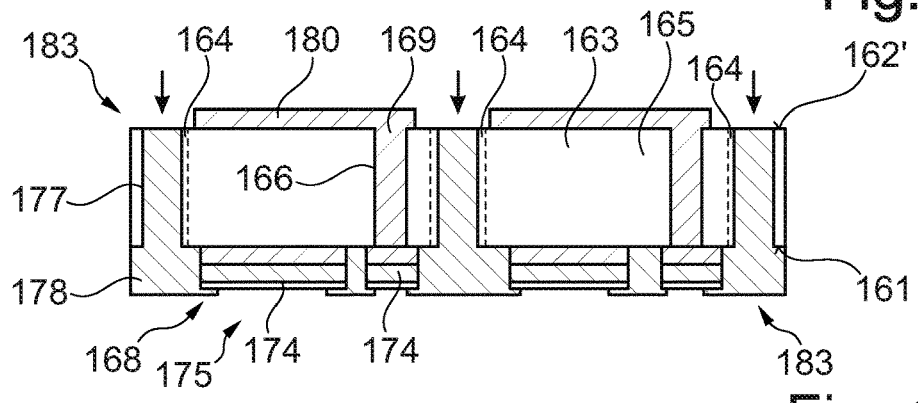

Conductive material 169 is inserted into the first trenches 166 from the worked second surface 162' as illustrated in FIG. 11D. The conductive material 169 may include two or more sublayers. An embodiment is illustrated in FIG. 12, in which the conductive material 169 includes sublayers of titanium, titanium tungsten and copper in this order on the side walls 171 or titanium and copper in this order of the side wall 171. The copper may be deposited using a two or more different methods, for example, physical vapour deposition, such as sputtering, to deposit a first copper layer and galvanic deposition to deposit further copper layer and increase the thickness filling the second trenches 166.

The first trenches 166 may be inserted into the worked second surface 162' by etching the worked second surface 162'. A sublayer of the first metallisation layer may be used as an etch stop. In some embodiments, for example for a first metallization layer 168 having the structure illustrated in FIG. 12, a tungsten sublayer may be used as an etch stop. The titanium sublayer of the conductive material 169 may be in direct contact with the tungsten layer of the first metallization layer 168.

The second metallisation layer 180 is then applied to the worked second surface 162', as illustrated in FIG. 11d, such that it is in contact with the conductive material 169 positioned in the first trench 166 and such that it is operably connected to an outer contact 174 on the first surface 161 of the semiconductor wafer 160. The semiconductor packages 183 are then singulated from the wafer 160 by cutting through the separation regions 164 and in particular, through the first polymer layer 178 positioned in the second trenches 177, as indicated schematically in FIG. 11d by arrows 189, to produce the semiconductor package 183 as illustrated in FIG. 10f.

As discussed above, the first metallisation structure 168 on the first major surface 161 of the semiconductor wafer 160 provides the outer contacts 174 for the semiconductor package 183. The semiconductor package 183 is mounted onto a higher level circuit board by way of the outer contacts 174, which are arranged on the first surface 161 of the semiconductor package 183. A solder connection can be used, which may be applied to the outer contacts 174 as illustrated in FIG. 10F.

The outer contacts 174 each have a lateral size and an arrangement within the outer contour of the lower surface of the semiconductor package 183 which is called the package footprint 175. The outer contacts 174 may have different arrangements and provide different package footprints.

Figure 13A:
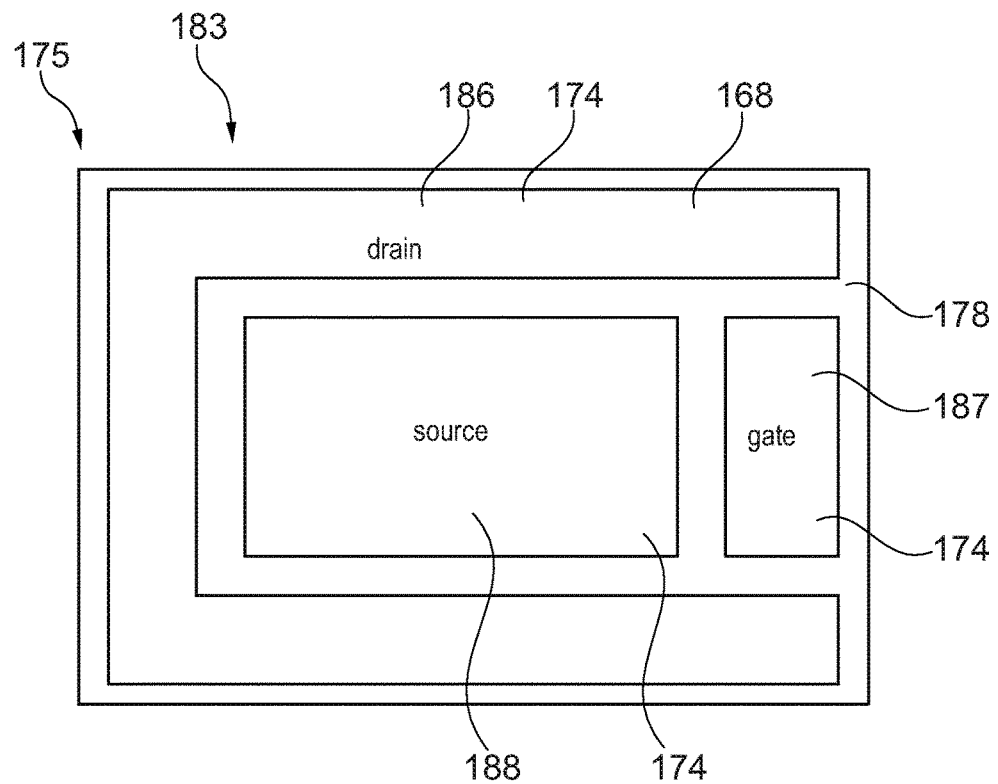
FIGS. 13A and 13B illustrate two package footprints.
Figure 13B:
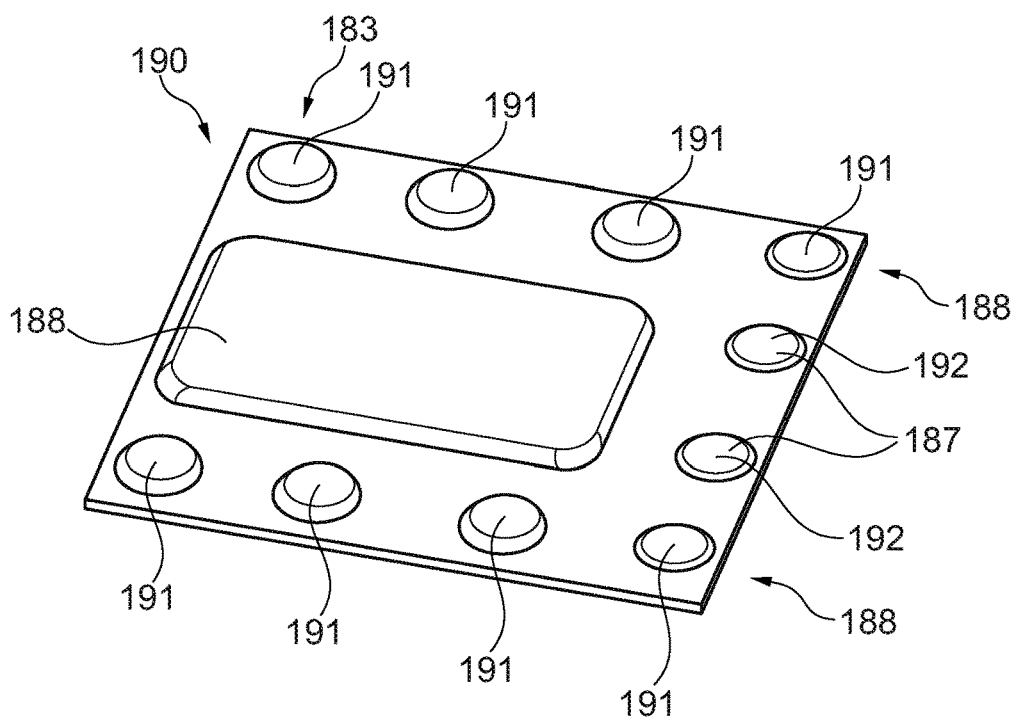

FIGS. 13A and 13B illustrate two examples of a package footprint which may be provided by the first metallisation layer 168 of the package 183. The package 183 includes a power transistor device 167, such as a vertical MOSFET device or vertical IGBT device and includes a footprint 175 including a drain outer contact 186, a gate outer contact 187 and a source outer contact 188.

In the embodiment illustrated in FIG. 13A, the drain outer contact 186 has a U-shape and extends along three sides of the package footprint 183. The source contact 188 and the gate contact 187 are positioned between the arms of the U with the gate contact 187 being positioned opposite the base of the U-shaped drain contact 186. The outer contacts 186, 187, 188 are spaced apart from one another by regions of the first polymer layer 178 which includes an epoxy.

FIG. 13B illustrates a perspective view of a package footprint 190 for the semiconductor package 183 according to another embodiment. The package 183 includes a power transistor device 167, such as a vertical MOSFET device or vertical IGBT device and includes a footprint 200 including a drain outer contact 186, a gate outer contact 187 and a source outer contact 188. In the package footprint 190, the source outer contact 188 has a general rectangular shape as in the package footprint 175. The drain outer contact 186 includes plurality of drain contact pads 191 which are arranged in two rows. The rows are arranged on two opposing sides of the first surface 161 of the semiconductor package 183 with the source pad 188 being arranged between the two rows. The gate outer contact 187 includes two gate contact pads 192 that are positioned adjacent the source pad 188 and between the two rows of four drain contact pads 191. The drain contact pads 191 and the gate contact pads 192 may each have a circular form. However, other forms, such as elongate of square may be used.

Figure 14:
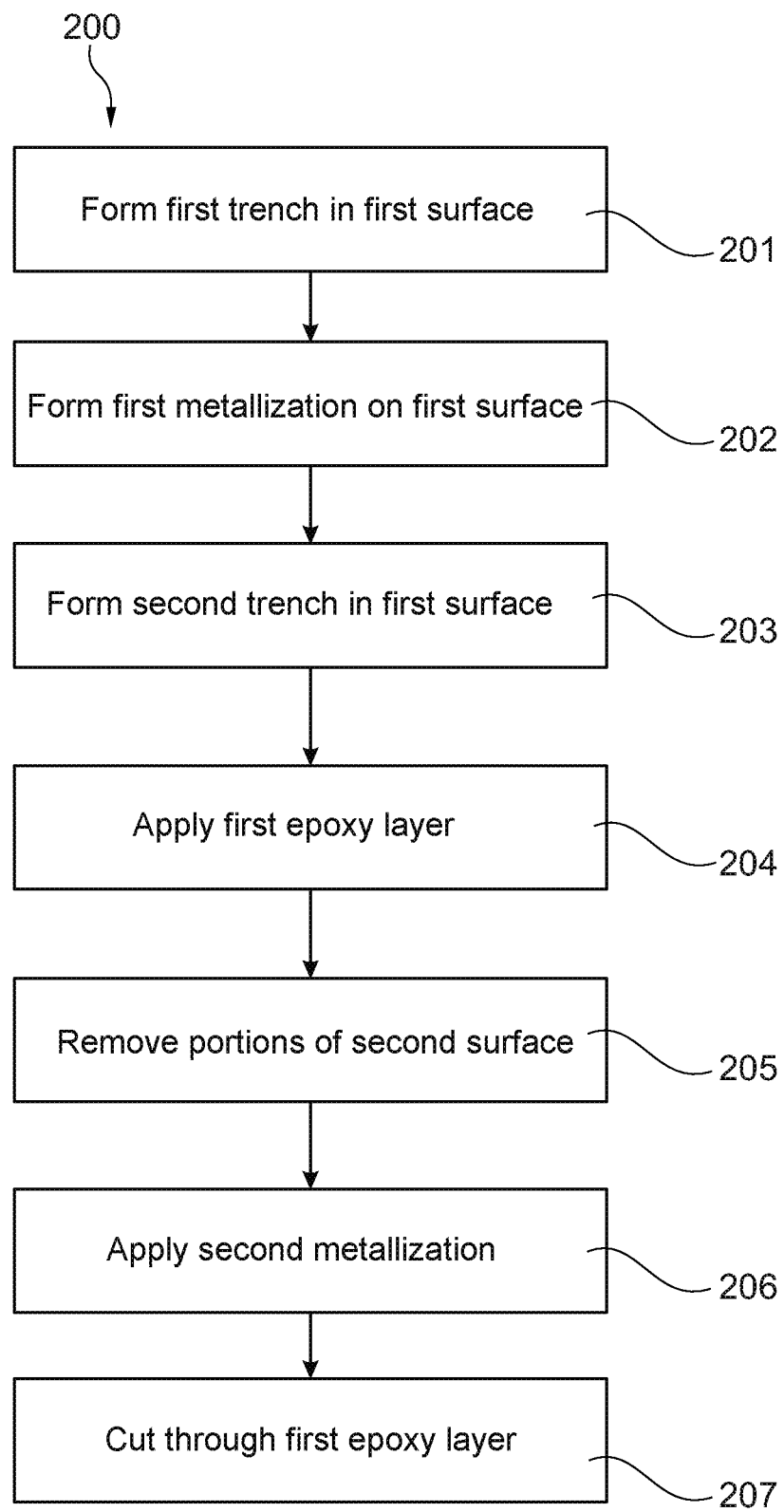
FIG. 14 illustrates a flow chart of a method of fabricating a semiconductor package according to an embodiment.

FIG. 14 illustrates a flow chart 200 of a method for fabricating a semiconductor package. In block 201, at least one first trench is formed in a first surface of the semiconductor wafer in a device region, wherein the semiconductor wafer comprises separation regions arranged between component positions of the semiconductor wafer, the component positions comprising the device region comprising an electronic device. In block 202, a first metallization structure is formed on the first surface in the component position, the first metallization structure comprising a plurality of outer contact pads forming a package footprint, and conductive material is inserted into the first trench. In block 203, at least one second trench is formed in the first surface of the semiconductor wafer in the separation regions. In block 204, a first epoxy layer is applied to the first surface of a semiconductor wafer such that the second trenches and edge regions of the component positions are covered with the first epoxy layer. In block 205, portions of a second surface of the semiconductor wafer are removed, the second surface opposing the first surface, and revealing portions of the first epoxy layer in the separation regions and the conductive material in the first trenches and producing a worked second surface. In block 206, a second metallization layer is applied to the worked second surface and operably coupling the second metallization layer to the conductive material and an outer contact pad on the first major surface. In block 207, the first epoxy layer is cut through in the separation regions to form a plurality of separate semiconductor packages.

In this embodiment, the via in the from of the first trench is inserted into the first surface of the wafer and conductive material is inserted from the first surface into the via. The first trench may be a blind via and the conductive material in the blind via is exposed at the rear surface by removing portions of the second surface.

Figure 15:
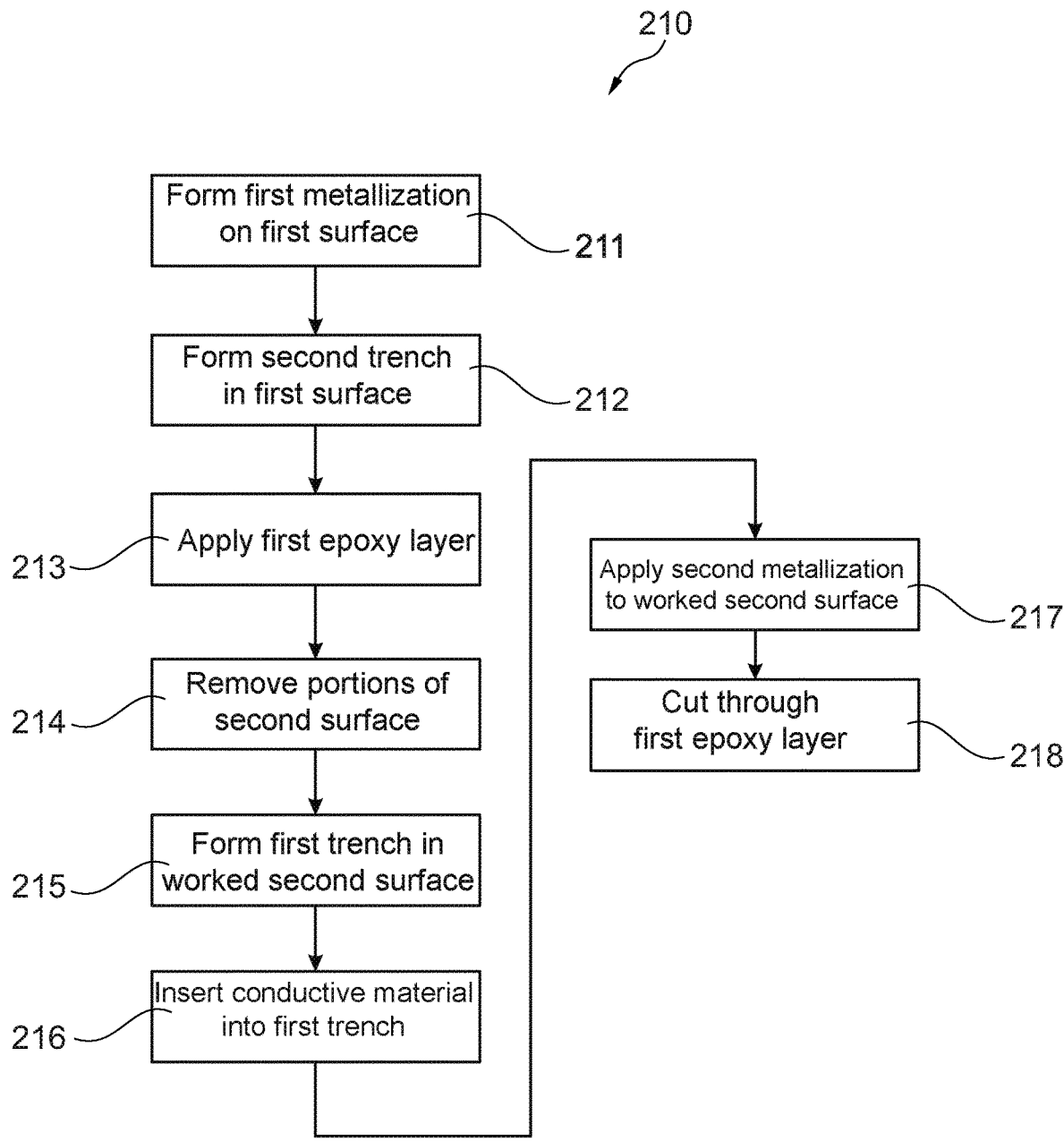
FIG. 15 illustrates a flow chart of a method of fabricating a semiconductor package according to an embodiment.

FIG. 15 illustrates a flow chart 210 of a method for fabricating a semiconductor package. In block 211, a first metallization structure is formed on a first surface of a semiconductor wafer, wherein the semiconductor wafer comprises separation regions arranged between component positions, the component positions comprising a device region comprising an electronic device, the first metallization structure being arranged on the component positions and comprising a plurality of outer contacts forming a package footprint. In block 212, at least one second trench is formed in the first surface of the semiconductor wafer in the separation regions. In block 213 a first epoxy layer is applied to the first surface of a semiconductor wafer such that the second trenches, and edge regions of the component positions are covered with the first epoxy layer. In block 214 portions of a second surface of the semiconductor wafer are removed, the second surface opposing the first surface, and revealing portions of the first epoxy layer in the separation regions. In block 215 at least one first trench is formed in the worked second surface of the semiconductor wafer in the device region of the component position. In block 216 conductive material is inserted into the first trench. In block 217 a second metallization layer is applied to the worked second surface and operably coupling the second metallization layer to the conductive material and an outer contact pad on the first major surface. In block 218 the first epoxy layer is cut through in the separation regions to form a plurality of separate semiconductor packages.

In this embodiment, the via in the from of the first trench is inserted into the worked second surface of the wafer and conductive material is inserted from the worked second surface into the via. The via is inserted into the worked second surface such that it extends through the entire thickness of the semiconductor wafer and such that the base of the first trench is formed by a portion of the first metallization structure. the conductive material in the first trench is deposited directly onto the portion of the first metallization layer exposed at the base of the first trench. The second metallization layer is applied to the conductive material in the first trench that is arranged at the worked second surface.

The semiconductor package includes outer contacts that are formed above the semiconductor material providing the semiconductor device. For example, for a vertical transistor device, the drain, source and gate outer contacts forming the package footprint are arranged on the first major surface of the semiconductor device with the drain region on the opposing second major surface of the semiconductor device being electrically coupled to the drain outer contact disposed on the opposing first major surface by use of the conductive via (or through silicon via) that is positioned in the semiconductor device. The side faces and portions of the first major surface arranged between the outer contacts are covered with a insulating layer, which is typically a polymer layer such as an epoxy resin. These structures are formed at the wafer level so that a separate packaging step, for example a molding step or the mounting of the semiconductor device in a metal can is not used.

EXAMPLES

Example 1. A method, comprising: forming at least one first trench in a first surface of a semiconductor wafer in a device region, wherein the semiconductor wafer comprises separation regions arranged between component positions of the semiconductor wafer, the component positions comprising the device region comprising an electronic device; forming a first metallization structure arranged on the first surface in the component position, the first metallization structure comprising a plurality of outer contact pads forming a package footprint, and inserting conductive material into the first trench; forming at least one second trench in the first surface of the semiconductor wafer in the separation regions; applying a first epoxy layer to the first surface of a semiconductor wafer such that the second trenches and edge regions of the component positions are covered with the first epoxy layer; removing portions of a second surface of the semiconductor wafer, the second surface opposing the first surface, and revealing portions of the first epoxy layer in the separation regions and the conductive material in the first trenches and producing a worked second surface; applying a second metallization layer to the worked second surface and operably coupling the second metallization layer to the conductive material and an outer contact pad on the first major surface; and cutting through the first epoxy layer in the separation regions to form a plurality of separate semiconductor packages.

Example 2. A method, comprising: forming a first metallization structure on a first surface of a semiconductor wafer, wherein the semiconductor wafer comprises separation regions arranged between component positions, the component positions comprising a device region comprising an electronic device, the first metallization structure being arranged on the component positions and comprising a plurality of outer contacts forming a package footprint; forming at least one second trench in the first surface of the semiconductor wafer in the separation regions; applying a first epoxy layer to the first surface of a semiconductor wafer such that the second trenches, and edge regions of the component positions are covered with the first epoxy layer; removing portions of a second surface of the semiconductor wafer, the second surface opposing the first surface, and revealing portions of the first epoxy layer in the separation regions; forming at least one first trench in the worked second surface of the semiconductor wafer in the device region of the component position; inserting conductive material into the first trench; applying a second metallization layer to the worked second surface and operably coupling the second metallization layer to the conductive material and an outer contact pad on the first major surface; and cutting through the first epoxy layer in the separation regions to form a plurality of separate semiconductor packages.

Example 3. The method of Example 1 or Example 2, wherein the cutting through the first epoxy comprises forming a cut having a width that is less than the width of the second trench so that at least portions of side faces of the plurality of separate semiconductor packages comprise a portion of the first epoxy layer.

Example 4. The method of any one of Examples 1 to 3, wherein the first epoxy layer further covers edge regions of the first metallization structure.

Example 5. The method of Examples 4, wherein openings in the first epoxy layer define the lateral size of the outer contact pads and the package footprint.

Example 6. The method of any one of Examples 1 to 5, further comprising applying a protective layer to the outer contact pads, wherein the protective layer comprises solder or Ag or Sn.

Example 7. The method of any one of Examples 1 to 6, wherein the first trench has a ratio of width to depth of 1:1 and the conductive material is inserted by electrodeposition.

Example 8. The method of any one of Examples 1 to 7, wherein the first metallization layer is formed by applying a Ti-containing layer, a W layer, a Al-containing layer and a Cu layer in this order.

Example 9. The method of Example 8, further comprising applying a TiN layer between the Ti-containing layer and the W layer.

Example 10. The method of any one of Examples 1 to 9, wherein the second metallization layer is formed by applying a Ti-containing layer and a Cu layer.

Example 11. The method according to Example 10, further comprising applying a TiW layer between the Ti-containing layer and the Cu layer.

Example 12. The method according to one of Examples 2 to 11, wherein the first trench is inserted into the worked second surface of the semiconductor wafer by etching and a W layer of the first metallization structure arranged on the first surface of the semiconductor wafer acts as an etch stop.

Example 13. The method of any one of Examples 1 to 12, further comprising applying a second epoxy layer to the worked second surface such that the second epoxy layer covers edge regions of the component positions and, optionally, edge regions of the second metallization layer, or such that the second epoxy layer entirely covers the second metallization layer.

Example 14. The method of any one of Examples 1 to 12, wherein the component positions of the semiconductor wafer further comprise a further electronic device, the further device region being laterally separated from the device region by a non-device region.

Example 15. The method of Example 14, wherein the first trench is positioned in the non-device region.

Example 16. The method of Example 14 or Example 15, wherein the second metallization layer is further applied to the further electronic device and operable couples the further electronic device to the conductive material and the outer contact pad on the first major surface and the electronic device.

Example 17. A semiconductor package, comprising: a first transistor device comprising: a first surface and a second surface opposing the first surface, a first power electrode and a control electrode arranged on the first surface and a second power electrode arranged on the second surface; a first metallization structure arranged on the first surface, the first metallization structure comprising a plurality of outer contact pads, the outer contact pads comprising a protective layer of solder, Ag or Sn; a second metallization structure arranged on the second surface; a conductive connection extending from the first surface to the second surface and electrically connecting the second power electrode to an outer contact pad of the first metallization structure; and a first epoxy layer arranged on side faces and on the first surface of the transistor device, the first epoxy layer comprising openings defining the lateral size of the outer contact pads and a package footprint.

Example 18. The semiconductor package of Example 17, further comprising a second epoxy layer on the second surface, wherein the second epoxy layer covers edge regions of the second surface and leaves a region of the second metallization layer exposed, or the second epoxy layer entirely covers the second metallization layer.

Example 19. The semiconductor package of Example 17 or Example 18, further comprising a second device, wherein the first conductive connection forms part of a conductive redistribution structure that electrically couples the first transistor device with the second device to form a circuit, wherein the conductive redistribution structure further comprises a conductive layer that is arranged on the conductive connection and on at least one of the second surface of the first transistor device and the second device.

Example 20. The semiconductor package of claim 19, wherein the second electronic device is a transistor device and the circuit is a half-bridge circuit, or the second electronic device is a driver device, or the second electronic device is an inductor or a capacitor or a resistor.

Example 21. A method, comprising: forming at least one trench in separation regions of a first surface of a semiconductor wafer; forming at least one trench in non-device regions of the first surface of the semiconductor wafer, wherein the separation regions are arranged between component positions of the semiconductor wafer, the component positions comprising at least two electronic devices for forming a circuit, a non-device region arranged between a first device region comprising a first electronic device and a second device region comprising a second electronic device, and a first metallization structure arranged on the first surface in the first device region and in the second device region; applying a first epoxy layer to the first surface of a semiconductor wafer such that the trenches, edge regions of the component positions, edge regions of the first device regions and edge regions of the second device regions are covered with the first epoxy layer; removing portions of a second surface of the semiconductor wafer, the second surface opposing the first surface, revealing portions of the first epoxy layer in the separation regions and in the non-device regions and producing a worked second surface; applying a second metallization layer to the worked second surface and operably coupling the first electronic device to the second electronic device to form the circuit; and inserting a separation line through the first epoxy layer in the separation regions to form a plurality of separate semiconductor modules comprising the circuit.

Example 22. The method of Example 21, further comprising: inserting a via into the second device region; inserting conductive material into the via; and electrically coupling the conductive material to the first electronic device and to the second electronic device.

Example 23. The method of Example 22, wherein the via is inserted into the first surface of the semiconductor wafer and afterwards, the first metallization structure and the first epoxy layer is applied to the first surface and portions of the second surface of the semiconductor wafer are removed, or the via is inserted into the worked second surface of the semiconductor wafer.

Example 24. The method of Example 21, further comprising: inserting conductive material into the trench formed in the non-device region; and electrically coupling the conductive material to the first electronic device and to the second electronic device.

Example 25. The method of Example 24, wherein the first epoxy layer is inserted into the trench formed in the non-device region, a via is formed in the first epoxy layer in the non-device regions such that side faces of the first device region and of the second device region bounding the via are covered with the first epoxy layer and the conductive material is applied to the first epoxy layer in the via, the conductive material extending from the first metallization structure in the second device region to the worked second surface.

Example 26. The method of Example 21, wherein a conductive via from the first surface of the semiconductor wafer to the worked second surface of the semiconductor wafer is formed by a conductive portion of the first device region or of the second device region, the conductive portion extending from the first surface of the semiconductor wafer to the worked second surface of the semiconductor wafer.

Example 27. The method of any one of Examples 21 to 26, wherein the second metallization layer is applied to the conductive material within the via to operably couple the first electronic device to the second electronic device.

Example 28. The method of any one of Examples 21 to 27, wherein the second metallization layer is applied such that it extends from the first device region over the non-device region to the second device region.

Example 29. The method of any one of Examples 21 to 28, wherein the separation line has a width that is less than the width of the trench in the separation region such that at least portions of side faces of the plurality of separate semiconductor modules comprise a portion of the first epoxy layer.

Example 30. The method of any one of Examples 21 to 29, wherein the first epoxy layer further covers edge regions of the first metallization structure.

Example 31. The method of any one of Examples 21 to 30, further comprising applying a second epoxy layer to the worked second surface that covers at least the first epoxy layer arranged in the separation regions.

Example 32. The method of Example 21, wherein the second epoxy layer covers the second metallization layer arranged on the first device region and exposes the second metallization layer arranged on the second device region.

Example 33. A module, comprising: a first electronic device in a first device region; a second electronic device in a second device region, wherein the first electronic device is operably coupled to the second electronic device to form a circuit; a first major surface comprising at least one contact pad; a second major surface comprising at least one contact pad, the second major surface opposing the first major surface; a first epoxy layer arranged on the first major surface that leaves at least portions of the first contact pad exposed, wherein side faces of the first electronic device and of the second electronic device are embedded in, and in direct contact with, the first epoxy layer; and a conductive redistribution structure that electrically couples the first electronic device with the second electronic device to form the circuit, wherein the conductive redistribution structure comprises a conductive via extending from the first major surface to the second major surface and a conductive layer that is arranged on the conductive via and on at least one of the first device region and the second device region.

Example 34. The module of Example 33, wherein the first electronic device is a transistor device, the second electronic device is a transistor device and the circuit is a half-bridge circuit, or the first electronic device is a transistor device and the second electronic device is a driver device, or the first electronic device is a transistor device and the second electronic device is an inductor or a capacitor or a resistor.

Example 35. An electronic component, comprising: the module of Example 33 or Example 34; a plurality of leads, wherein the first contact pad is coupled to a first lead of the plurality of leads and the second contact pad is coupled to a second lead of the plurality of leads; and a plastic housing composition, wherein the plastic housing composition covers the first epoxy layer, the second epoxy layer and portions of the plurality of leads.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
providing a semiconductor wafer comprising separation regions arranged between component positions, the component positions comprising a first device region and a second device region, the first and second device regions each comprising an electronic device and being separated from one another by a non-device region;
forming a first metallization structure on a first surface of the semiconductor wafer;
forming at least one second trench in the first surface of the semiconductor wafer in the separation regions while the first metallization structure is exposed at the first surface;
applying a first epoxy layer to fill the at least one second trench with the first epoxy layer;
removing portions of a second surface of the semiconductor wafer, the second surface opposing the first surface, to form a worked second surface of the semiconductor wafer and to reveal portions of the first epoxy layer in the separation regions;
applying a second metallization layer to the worked second surface;
operably coupling the second metallization layer to the first metallization structure; and
cutting through the first epoxy layer in the separation regions to form a plurality of separate semiconductor packages, each of the separate semiconductor packages comprising the first device region and the second device region.

2. The method of claim 1, wherein the first metallization structure is formed to be positioned on the first and second device regions and not present in the non-device region.

3. The method of claim 2, wherein the first metallization structure is formed into a plurality of outer contact pads with gaps between the outer contact pads that expose the first surface of the semiconductor wafer.

4. The method of claim 2, wherein the first epoxy layer is applied to the first surface of the semiconductor wafer such that the first epoxy layer comprises openings, wherein outer surfaces of the outer contact pads that are opposite from the first surface of the semiconductor wafer are at least partially exposed by the openings in the first epoxy layer.

5. The method of claim 1, wherein operably coupling the second metallization layer to the first metallization structure comprises forming at least one first trench in one of the first and second device regions and filling the at least one first trench with conductive material, wherein the second metallization layer is operably coupled to the second metallization layer by the conductive material.

6. The method of claim 5, wherein at the least one first trench is formed in the first surface of the semiconductor wafer before removing portions of the second surface, and wherein removing portions of the second surface exposes the conductive material at the worked second surface.

7. The method of claim 5, wherein at the least one first trench is formed at the worked second surface after removing portions of the second surface.

8. The method of claim 7, wherein the first metallization structure acts as an etch stop for forming the at the least one first trench.

9. The method of claim 1, wherein cutting through the first epoxy layer comprises forming a cut having a width that is less than a width of the at least one second trench so that at least portions of side faces of the plurality of separate semiconductor packages comprise a portion of the first epoxy layer.

10. The method of claim 1, wherein the first epoxy layer further covers edge regions of the first metallization structure.

11. The method of claim 10, wherein the first metallization structure is formed into a plurality of outer contact pads with gaps between the outer contact pads that expose the first surface of the semiconductor wafer, and wherein openings in the first epoxy layer define a lateral size of the plurality of outer contact pads and the package footprint.

12. The method of claim 1, wherein the first metallization structure is formed into a plurality of outer contact pads with gaps between the outer contact pads that expose the first surface of the semiconductor wafer, and wherein the method further comprises applying a protective layer comprising solder or Ag or Sn to the plurality of outer contact pads.

13. The method of claim 1, wherein the at least one first trench has a ratio of width to depth of 0.5:1 to 1.5:1.0 and the conductive material is inserted by electrodeposition.

14. The method of claim 1, wherein the first metallization layer is formed by first applying a Ti-containing layer, then applying a W layer, then applying a Al-containing layer and then applying a Cu layer.

15. The method of claim 14, further comprising applying a TiN layer between the Ti-containing layer and the W layer.

16. The method of claim 1, wherein the second metallization layer is formed by first applying a Ti-containing layer and then applying a Cu layer.

17. The method of claim 16, further comprising applying a TiW layer between the Ti-containing layer and the Cu layer.

18. The method of claim 1, further comprising applying a second epoxy layer to the worked second surface such that the second epoxy layer covers edge regions of the component positions, or such that the second epoxy layer entirely covers the second metallization layer.

19. The method of claim 1, wherein the component positions of the semiconductor wafer each comprise a second device area, the second device area being laterally separated from the first and second device regions, respectively, by another non-device region.

20. The method of claim 19, wherein the at least one first trench is positioned in the another non-device region.

21. The method of claim 1, further comprising applying a carrier to an outer surface of the first epoxy layer after applying the first epoxy layer, wherein carrier, the first metallization structure, and the first epoxy layer collectively form enclosed cavities.

22. The method of claim 1, wherein the second metallization layer directly contacts the worked second surface of the semiconductor wafer.

23. The method of claim 1, wherein in each of the separate semiconductor packages the component positions of the semiconductor wafer form the only semiconductor devices.

* * * * *